US012660170B2

(12) United States Patent
Chen et al.

(10) Patent No.: US 12,660,170 B2
(45) Date of Patent: Jun. 16, 2026

(54) MEMORY DEVICE HAVING AN ARRAY OF VERTICAL TRANSISTORS WITH ASSOCIATED LINES AND METHOD FOR FORMING THE SAME

(71) Applicant: YANGTZE MEMORY TECHNOLOGIES CO., LTD., Wuhan (CN)

(72) Inventors: He Chen, Wuhan (CN); Ziqun Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 421 days.

(21) Appl. No.: 18/197,505

(22) Filed: May 15, 2023

(65) Prior Publication Data

US 2023/0371244 A1     Nov. 16, 2023

Related U.S. Application Data

(63) Continuation of application No. PCT/CN2023/090829, filed on Apr. 26, 2023.

(Continued)

(51) Int. Cl.
H10B 12/00 (2023.01)

(52) U.S. Cl.
CPC ........... H10B 12/482 (2023.02); H10B 12/09 (2023.02); H10B 12/50 (2023.02)

(58) Field of Classification Search
CPC ...... H10B 12/482; H10B 12/09; H10B 12/50; H10B 12/00; H10B 12/05; H10B 12/485;

(Continued)

(56) References Cited

U.S. PATENT DOCUMENTS

2009/0294833 A1*  12/2009  Kim ........................ H10B 12/50
                                                              257/324
2012/0214285 A1*   8/2012  Guha ................... H10D 30/025
                                                              438/270

(Continued)

FOREIGN PATENT DOCUMENTS

CN           114141712 A      3/2022
JP           2011187652 A     9/2011
(Continued)

OTHER PUBLICATIONS

International Search Report issued in corresponding International Application No. PCT/CN2023/090829, mailed Aug. 1, 2023, 3 pages.

(Continued)

*Primary Examiner* — John P. Dulka
(74) *Attorney, Agent, or Firm* — BAYES PLLC

(57) ABSTRACT

A three-dimensional memory device having vertical transistors and a method for forming the same are disclosed. In an example, the memory device includes an array of memory cells each including a vertical transistor. Along a first direction, one of the vertical transistors is arranged between two of separation structures in a plan view. Each of the separation structures includes a protrusion, and the separation structure and a corresponding protrusion are integral. The memory device also includes a plurality of bit lines that include at least one conductive layer. The at least one conductive layer is arranged between two protrusions of the two separation structures and on the one of vertical transistors to couple one of the bit lines with the one of the vertical transistors.

20 Claims, 33 Drawing Sheets

<u>700</u>

Related U.S. Application Data

(60) Provisional application No. 63/340,686, filed on May 11, 2022.

(58) Field of Classification Search
CPC ... H10B 12/488; H10B 12/315; H10D 30/025
See application file for complete search history.

(56) References Cited

U.S. PATENT DOCUMENTS

| | | |
|---|---|---|
| 2013/0161781 A1 | 6/2013 | Lee |
| 2021/0151440 A1 | 5/2021 | Tang et al. |
| 2023/0013420 A1 | 1/2023 | Tang |
| 2023/0069096 A1 | 3/2023 | Yang et al. |
| 2023/0301064 A1* | 9/2023 | Shao ................... H10B 12/312 |

FOREIGN PATENT DOCUMENTS

| | | |
|---|---|---|
| JP | 2014082287 A | 5/2014 |
| JP | 2022519660 A | 3/2022 |
| KR | 20080075086 A | 8/2008 |
| KR | 20130073488 A | 7/2013 |
| WO | 2007047390 A2 | 4/2007 |

OTHER PUBLICATIONS

Communication under Rule 71(3) EPC issued in corresponding European Application No. 23725566.6, mailed Feb. 17, 2026, 8 pages.

* cited by examiner

<u>800</u>

Sectional View along 9A-9A line

Top View

Sectional View along 9C-9C line

Top View (without 901)

Sectional View along 9D-9D line

905

Top View

Sectional View along 9E-9E line

<u>905</u>

Top View

Sectional View along 9F-9F line

<u>905</u>

Top View

1000

PREPARE A TRANSFER SUBSTRATE — 1002

FORM A CUT LAYER IN THE TRANSFER SUBSTRATE — 1004

FORM A SACRIFICIAL LAYER
FROM A TRENCH AND FILL THE TRENCH WITH A DIELECTRIC — 1006

CUT ALONG THE CUT LAYER
BOND WITH A CARRIER SUBSTRATE ON A FRONT SIDE — 1010

Sectional View along 11A-11A line

<u>1100</u>

Top View

Sectional View along 11B-11B line

<u>1100</u>

Top View

Sectional View along 11C-11C line

1103

Top View

Sectional View along 11D-11D line

1103

Top View

1103

Sectional View along 11F-11F line

<u>1107</u>

Top View

Sectional View along 11H-11H line

1107

Top View

Sectional View along 11I-11I line

<u>1107</u>

Top View

Sectional View along 11J-11J line

Sectional View along 12A-12A line

1203

Top View

Sectional View along 12C-12C line

Top View

Sectional View along 12D-12D line

1207

Top View

<u>1300</u>

PREPARE A TRANSFER SUBSTRATE — 1302

FORM A CUT LAYER IN THE TRANSFER SUBSTRATE AND FORM
SACRIFICIAL LAYER ON THE TRANSFER SUBSTRATE — 1304

CUT ALONG THE CUT LAYER
BOND WITH A CARRIER SUBSTRATE ON A FRONT SIDE — 1306

FROM A TRENCH AND FILL THE TRENCH WITH A DIELECTRIC — 1308

Sectional View along 14A-14A line

Top View

Sectional View along 14C-14C line

<u>1403</u>

Top View

MEMORY DEVICE HAVING AN ARRAY OF VERTICAL TRANSISTORS WITH ASSOCIATED LINES AND METHOD FOR FORMING THE SAME

CROSS-REFERENCE TO RELATED APPLICATIONS

This application is a continuation of International Application No. PCT/CN2023/090829, filed on Apr. 26, 2023, entitled "MEMORY DEVICE HAVING VERTICAL TRANSISTORS AND METHOD FOR FORMING THE SAME," which claims the benefit of priority to U.S. Provisional Application No. 63/340,686, filed on May 11, 2022, both of which are incorporated herein by reference in their entireties.

BACKGROUND

Embodiments of the present disclosure relate to methods of forming memory devices having vertical transistors, memory devices, and memory systems thereof.

The scalability of planar memory cells to smaller sizes depends on improving process technology, circuit design, programming algorithms, and fabrication processes. As feature sizes of the memory cells approach a lower limit, however, the planar processes and fabrication techniques become increasingly challenging and expensive. As a result, the memory density for planar memory cells reaches an upper limit.

To address the limitation of memory density in planar memory cells, a three-dimensional (3D) memory architecture has been introduced. The introduction of a 3D memory architecture has thus provided a promising solution to the limitations of planar memory cells.

SUMMARY

Embodiments of 3D memory devices and methods for forming the same are disclosed herein.

In some aspects, the memory device may include an array of memory cells each including a vertical transistor. Along a first direction, one of the vertical transistors may be arranged between two of separation structures in a plan view. Each of the separation structures may include a protrusion, and the separation structure and a corresponding protrusion may be integral. The memory device may include a plurality of bit lines that include at least one conductive layer. The at least one conductive layer may be arranged between two protrusions of the two separation structures and on the one of vertical transistors to couple one of the bit lines with the one of the vertical transistors.

In some implementations, the plan view is based on a first plane along the first direction. A projection of the at least one conductive layer, arranged between the two protrusions, on a second plane substantially has no overlapping with a projection of each of the two separation structures on the second plane, the second plane being perpendicular to the first plane.

In some implementations, the memory device may further include a plurality of word lines extending in the first direction and configured to connect gates of the vertical transistors, a depth of one of the word lines being smaller than a depth of one of the separation structures.

In some implementations, the memory device may further include a plurality of storage units, one of the storage units being connected with a corresponding one of the vertical transistors at an opposite side of the bit lines.

In some implementations, the one of the storage units may include a capacitor.

In some implementations, the capacitor is arranged in one or more inter-layer dielectric (IDL) layers at the opposite side of the bit lines.

In some implementations, the array of memory cells is arranged in a main memory area. The memory device may further include a capacitor contact arranged in a peripheral area outside the main memory area and electrically connected with the capacitor in the main memory area, the capacitor contact extending in a third direction along which the vertical transistors extend and including a joint portion, and sidewalls of the capacitor contact including a staggered profile at the joint portion.

In some implementations, a surface of the at least one conductive layer of the bit lines is substantially flush with a surface of the two protrusions of the two separation structures.

In some implementations, the at least one conductive layer may include a contact layer arranged between the two protrusions and in contact with the one of vertical transistors; and a metal layer arranged between the two protrusions and on the contact layer.

In some implementations, the contact layer may include silicide; and the metal layer may include tungsten.

In some implementations, the at least one conductive layer may include an interconnect layer arranged between the two protrusions and in contact with the one of the vertical transistors.

In some implementations, the interconnect layer is arranged in a main memory area and configured to connect with the one of the vertical transistors; and a sacrificial layer is arranged in a peripheral area outside the main memory area, a surface of the interconnect layer in the main memory area is substantially flush with a surface of the sacrificial layer in the peripheral area.

In some implementations, an oxide pad layer is arranged in the peripheral area and below the sacrificial layer.

In some implementations, the interconnect layer may include polysilicon.

In some implementations, a surface of the interconnect layer is substantially flush with a surface of the two protrusions of the two separation structures.

In some implementations, the bit lines may further include a metal layer in one or more inter-layer dielectric (ILD) layers and arranged on and in contact with the interconnect layer.

In some implementations, the interconnect layer continuously extends in a second direction perpendicular to the first direction and on the one of the vertical transistors.

In some implementations, the metal layer may include a metal dot disposed on the interconnect layer.

In some implementations, the interconnect layer is disconnected in a second direction perpendicular to the first direction; and the metal layer may include a metal wire connecting the interconnect layer.

In some implementations, the array of memory cells is arranged in a first semiconductor structure; and the memory device may further include a second semiconductor structure bonded to the first semiconductor structure and including peripheral circuits, the peripheral circuits being coupled to and configured to control the array of memory cells through the bit lines.

In still some aspects, a memory system is provided. The memory system may include a memory device configured to store data and including a first semiconductor structure including peripheral circuits; and a second semiconductor structure bonded to the first semiconductor structure and including an array of memory cells each including a vertical transistor, wherein along a first direction, one of the vertical transistors is arranged between two of separation structures in a plan view, each of the separation structures including a protrusion, and the separation structure and a corresponding protrusion being integral; and a plurality of bit lines including at least one conductive layer, wherein the at least one conductive layer is arranged between two protrusions of the two separation structures and on the one of vertical transistors to couple one of the bit lines with the one of the vertical transistors, the memory cells being coupled to the peripheral circuits through the bit lines. The memory system may further include a memory controller coupled to the memory device and configured to control the memory cells through the peripheral circuits.

In still some aspects, a method of forming a memory device is provided. The method may include: forming a plurality of separation structures; forming an array of memory cells each including a vertical transistor, wherein along a first direction perpendicular to a second direction along which the separation structures extend, one of the vertical transistors is arranged between two of the separation structures in a plan view; forming a plurality of protrusions each on one of the separation structures; and forming a plurality of bit lines including at least one conductive layer, wherein the at least one conductive layer is arranged in a recess between two protrusions of the two separation structures and on the one of the vertical transistors to couple one of the bit lines with the one of the vertical transistors.

In some implementations, the method may further include forming a plurality of capacitors in one or more inter-layer dielectric (IDL) layers, one of the capacitors being connected with a corresponding one of the vertical transistors at an opposite side of the bit lines.

In some implementations, the array of memory cells and the capacitors are arranged in a main memory area; and the method may further include: forming a capacitor contact in a peripheral area outside the main memory area and electrically connected with the one of the capacitors, connected with the one of the vertical transistors, in the main memory area, the capacitor contact extending in a third direction along which the vertical transistors extend and including a joint portion, and sidewalls of the capacitor contact including a staggered profile at the joint portion.

In some implementations, forming the plurality of separation structures may include preparing a substrate including a device layer, a handle layer, and a buried oxide (BOX) layer between the device layer and the handle layer; removing, at least through the BOX layer, a first portion of the device layer and the handle layer to form a plurality of first trenches along the second direction; and filling a first dielectric material into each of the plurality of first trenches to form the separation structures in the substrate.

In some implementations, the method may further include removing a second portion of the device layer to form a plurality of second trenches along the first direction, wherein: forming the memory cells may include forming the vertical transistors corresponding to the second trenches; and the method may further include forming a plurality of word lines each corresponding to one of the second trenches and configured to connect gates of the vertical transistors in a row of the array of memory cells.

In some implementations, a depth of one of the second trenches is less than a depth of one of the first trenches.

In some implementations, forming the protrusions may include bonding the substrate to a carrier substrate at a front side of the substrate; and removing a remaining handle layer of the substrate to expose the BOX layer and the separation structures, one end of each of the separation structures forming a protrusion, and the recess is formed between the two protrusions of the two separation structures.

In some implementations, the recess is a third trench extending along the second direction.

In some implementations, forming the plurality of bit lines may include removing a portion of the BOX layer, on the one of the vertical transistors, in the third trench; and depositing the at least one conductive layer in the third trench, a surface of the at least one conductive layer being substantially flush with a surface of the two protrusions of the separation structures.

In some implementations, the at least one conductive layer may include a contact layer arranged in the third trench and in contact with the one of vertical transistors; and a metal layer arranged in the third trench and on the contact layer.

In some implementations, the contact layer may include silicide; and the metal layer may include tungsten.

In some implementations, forming the plurality of separation structures may include: preparing a transfer substrate including a silicon substrate, a cut layer in the silicon substrate, and an oxide pad layer on the silicon substrate; forming a sacrificial layer on the oxide pad layer; removing a portion of the oxide pad layer and the sacrificial layer in a device layer of the transfer substrate to form a plurality of fourth trenches along the second direction; filling a second dielectric material into each of the plurality of fourth trenches to form the separation structures; splitting the device layer from the transfer substrate along the cut layer; bonding a front side of the device layer to a carrier substrate to form a first semiconductor structure; and removing a back side of the device layer to expose the separation structures.

In some implementations, the portion of the oxide pad layer and the sacrificial layer as removed is a first portion of the oxide pad layer and the sacrificial layer; the array of memory cells is arranged in a main memory area; and a second portion of the oxide pad layer and the sacrificial layer remains in a peripheral area outside the main memory area.

In some implementations, the method may further include applying ion implantation into the transfer substrate to a depth to form the cut layer in the transfer substrate.

In some implementations, the method may further include removing a portion of the first semiconductor structure to form a plurality of fifth trenches along the first direction, wherein: forming the memory cells may include forming the vertical transistors corresponding to the fifth trenches; and the method may further include forming a plurality of word lines each corresponding to one of the fifth trenches and configured to connect gates of the vertical transistors in a row of the array of memory cells.

In some implementations, forming the protrusions may include: bonding a front side of the first semiconductor structure to a base substrate to form a second semiconductor structure; removing a portion of the second semiconductor structure to expose the sacrificial layer; and removing, using a mask, a portion of the sacrificial layer and the oxide pad layer to expose the vertical transistors and the separation structures, one end of each of the separation structures forming a protrusion, and the recess is formed between the two protrusions of the two separation structures.

In some implementations, a depth of one of the fifth trenches is less than a depth of one of the separation structures.

In some implementations, the recess is a sixth trench extending along the second direction.

In some implementations, forming the plurality of bit lines may further include: depositing an interconnect layer in the sixth trench and in contact with the one of the vertical transistors, a surface of the interconnect layer being substantially flush with a surface of the two protrusions of the separation structures, the at least one conductive layer including the interconnect layer; and forming a metal layer in one or more inter-layer dielectric (ILD) layers and on the interconnect layer.

In some implementations, the interconnect layer may include polysilicon, and the metal layer may include tungsten.

In some implementations, the metal layer may include a metal dot on the interconnect layer.

In some implementations, a depth of one of the fifth trenches is approximately equal to a depth of one of the separation structures.

In some implementations, forming the plurality of bit lines may include: depositing an interconnect layer in the recess and in contact with the one of the vertical transistors, a surface of the interconnect layer being substantially flush with a surface of the two protrusions of the separation structures, the at least one conductive layer including the interconnect layer; and forming a metal layer in one or more inter-layer dielectric (ILD) layers and on the interconnect layer.

In some implementations, the interconnect layer may include polysilicon, and the metal layer may include tungsten.

In some implementations, the interconnect layer is disconnected in the second direction; and the metal layer may include a metal wire connecting the interconnect layer.

In some implementations, forming the plurality of separation structures may include: preparing a transfer substrate including a cut layer in a silicon substrate and a device layer including an oxide pad layer on the silicon substrate, and a sacrificial layer on the oxide pad layer; splitting a device layer off from the transfer substrate along the cut layer; bonding a front side of the device layer to a carrier substrate to form a third semiconductor structure; removing a portion of the third semiconductor structure to form a plurality of seventh trenches along the second direction; and filling a third dielectric material into each of the plurality of seventh trenches to form the separation structures.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

6

Figure 3:
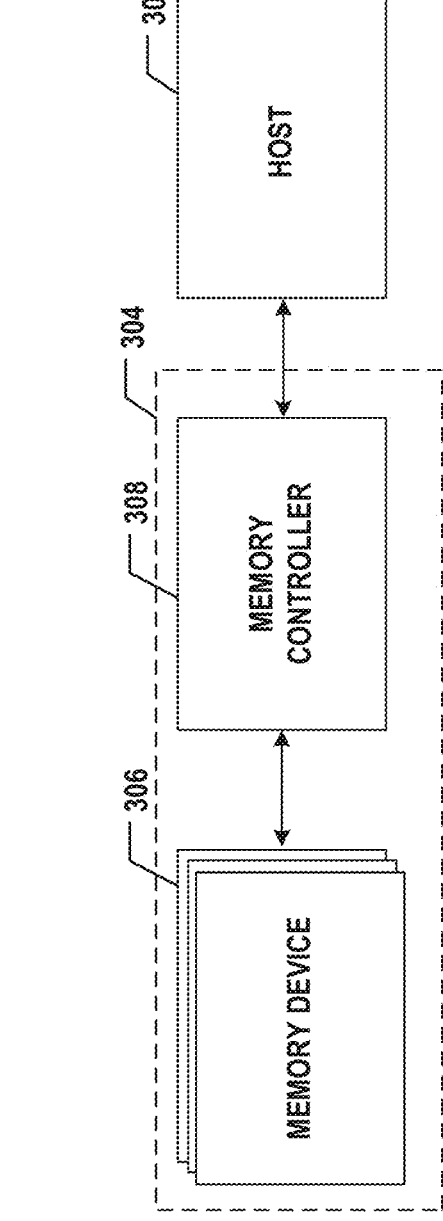

FIG. 3 illustrates a schematic diagram of an exemplary system having a memory device, according to some aspects of the present disclosure.

Figure 4:
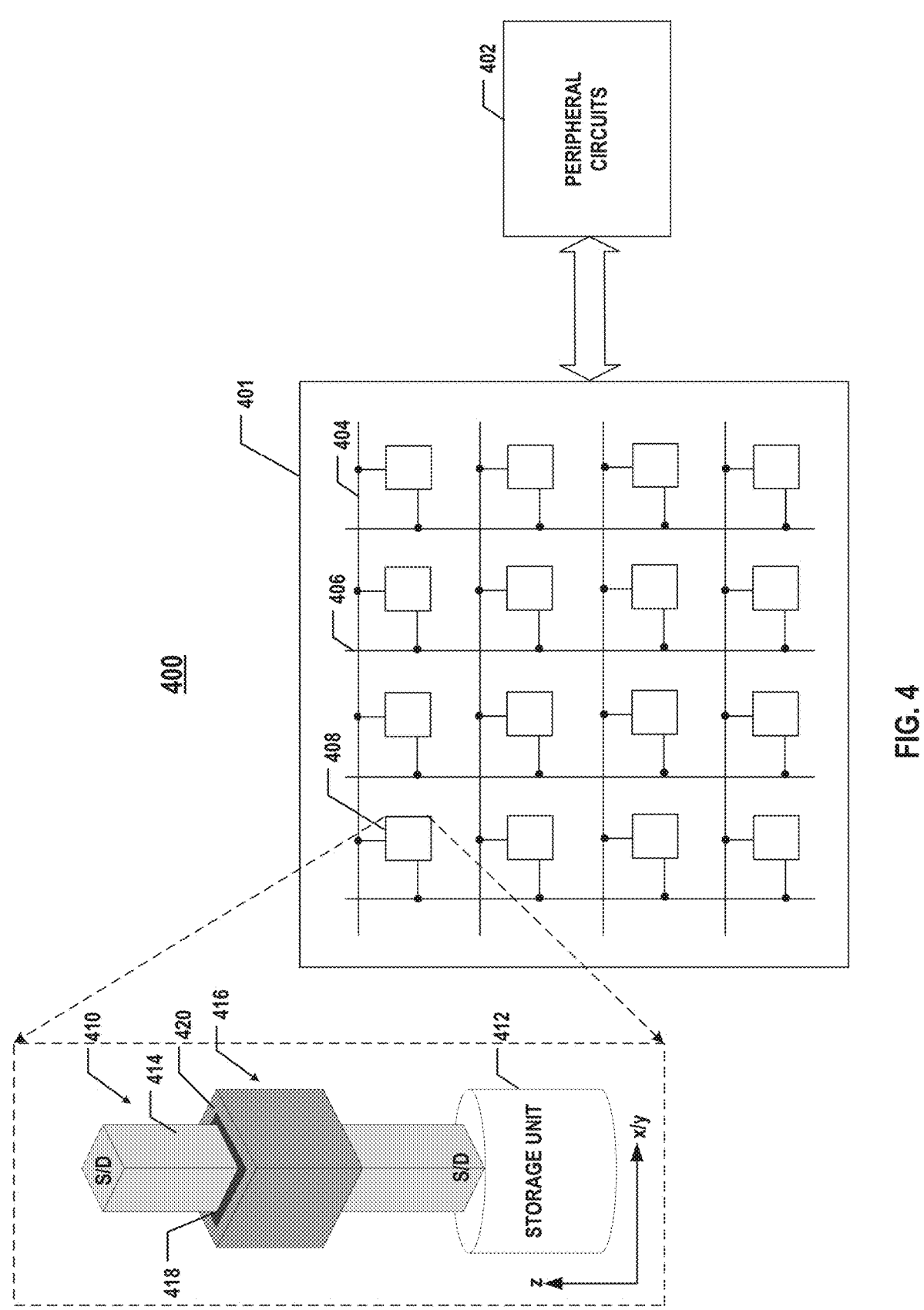

FIG. 4 illustrates a schematic diagram of an exemplary memory device including peripheral circuits and an array of memory cells each having a vertical transistor, according to some aspects of the present disclosure.

Figure 5:
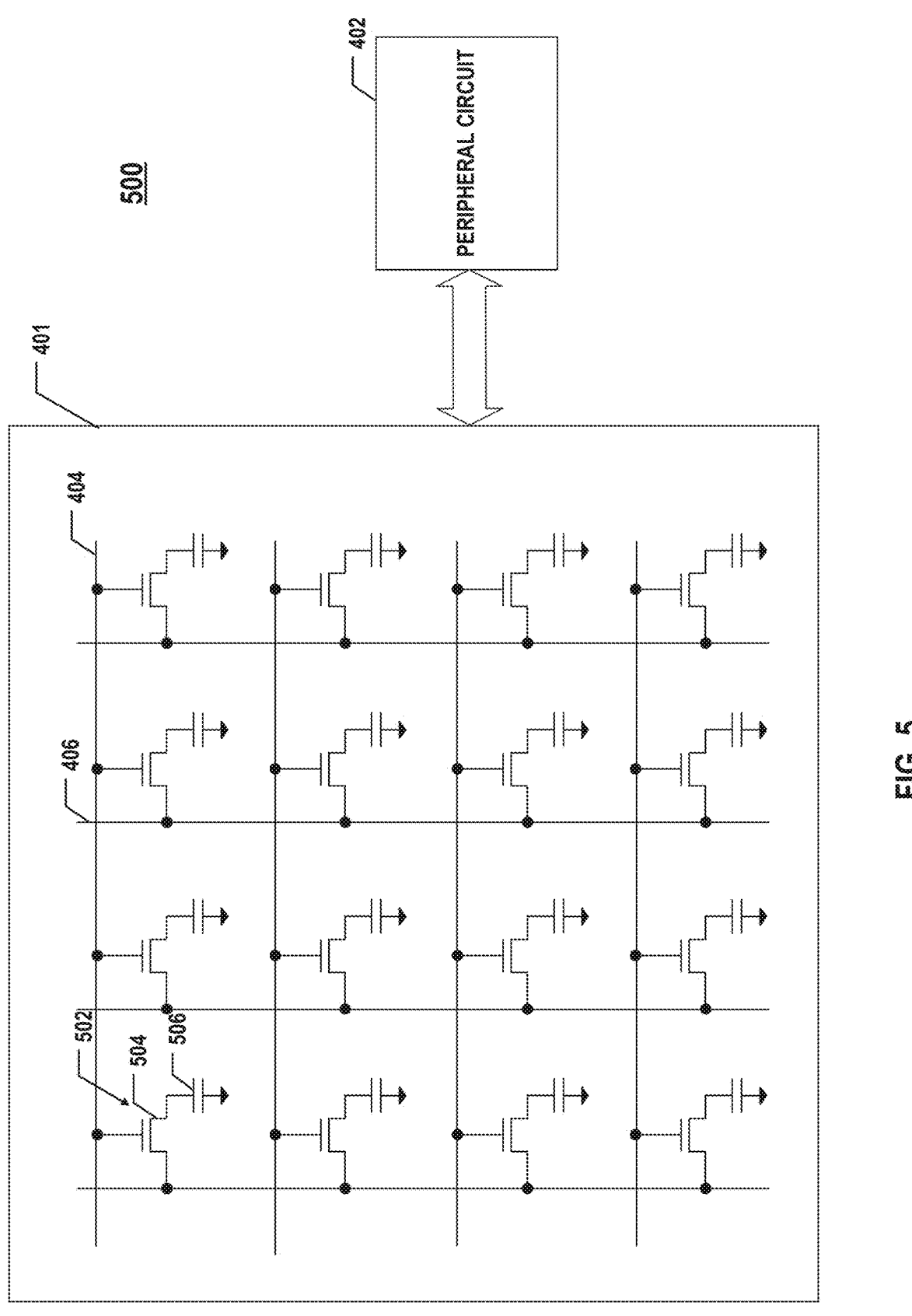

FIG. 5 illustrates a schematic circuit diagram of an exemplary memory device including peripheral circuits and an array of dynamic random-access memory (DRAM) cells, according to some aspects of the present disclosure.

Figure 6:
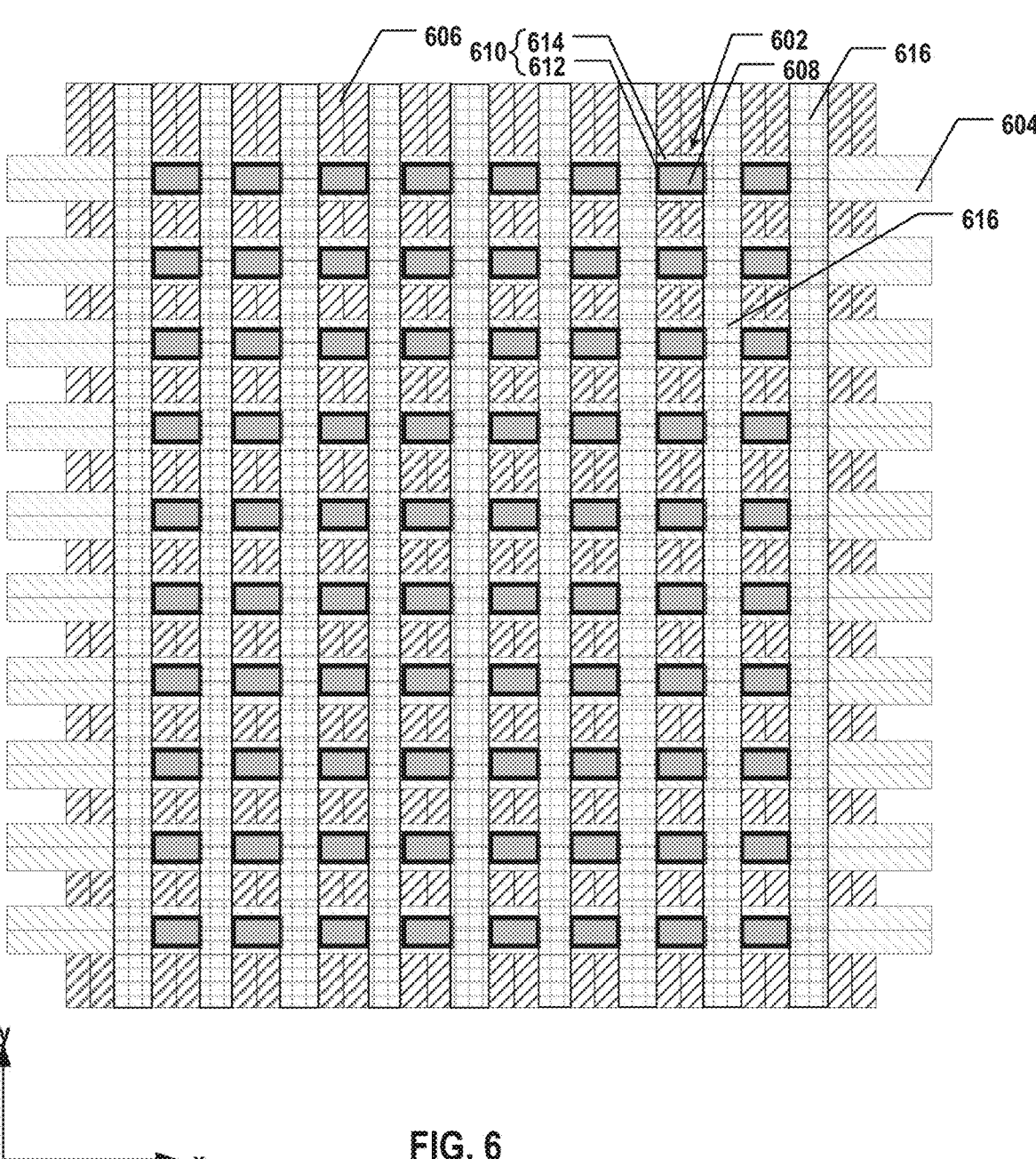

FIG. 6 illustrates a plan view of an exemplary array of memory cells each including a vertical transistor in a memory device, according to some aspects of the present disclosure.

Figure 7:
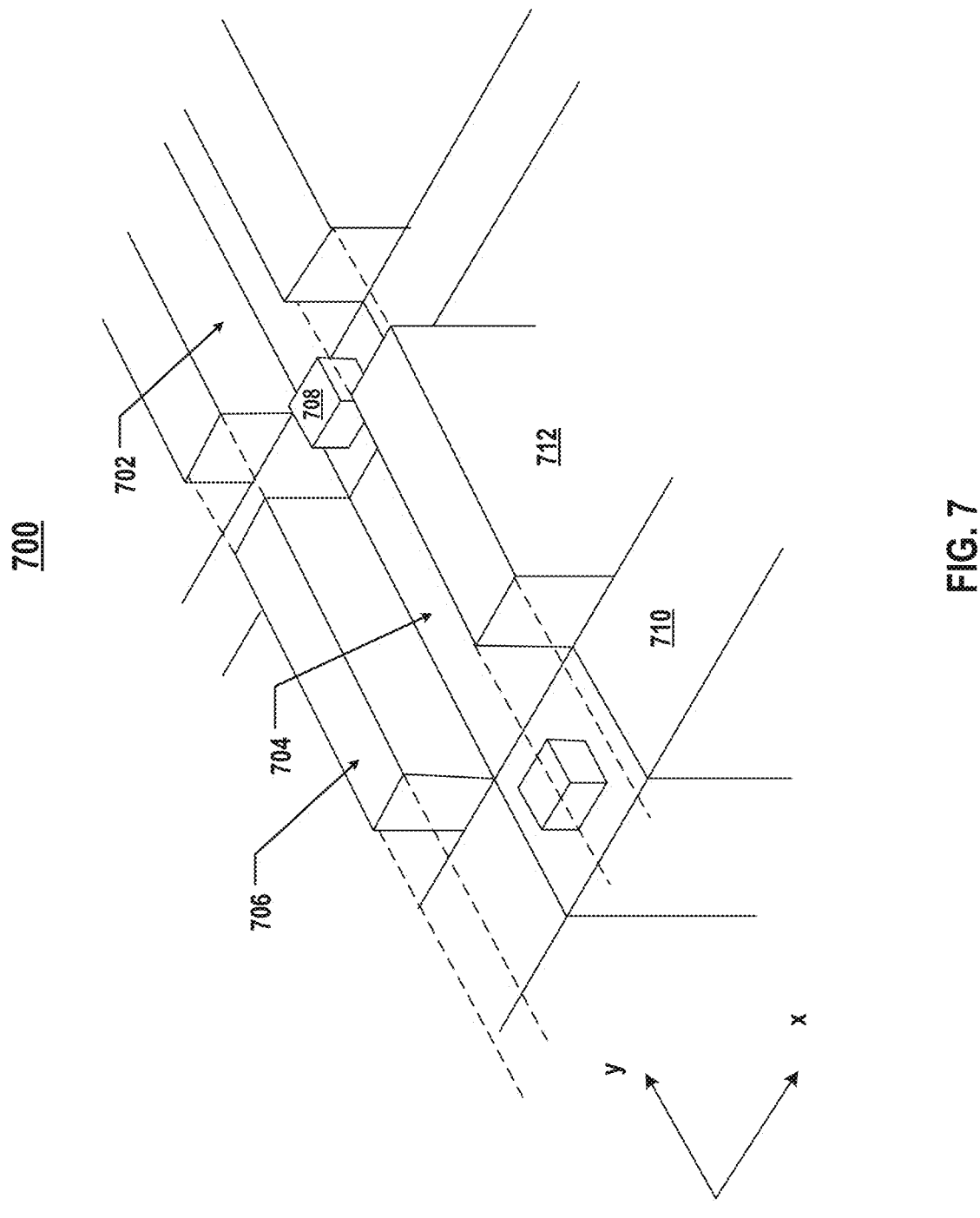

FIG. 7 illustrates a perspective view schematically showing an exemplary 3D memory device including protrusions for forming self-aligned bit lines, according to some aspects of the present disclosure.

Figure 8:
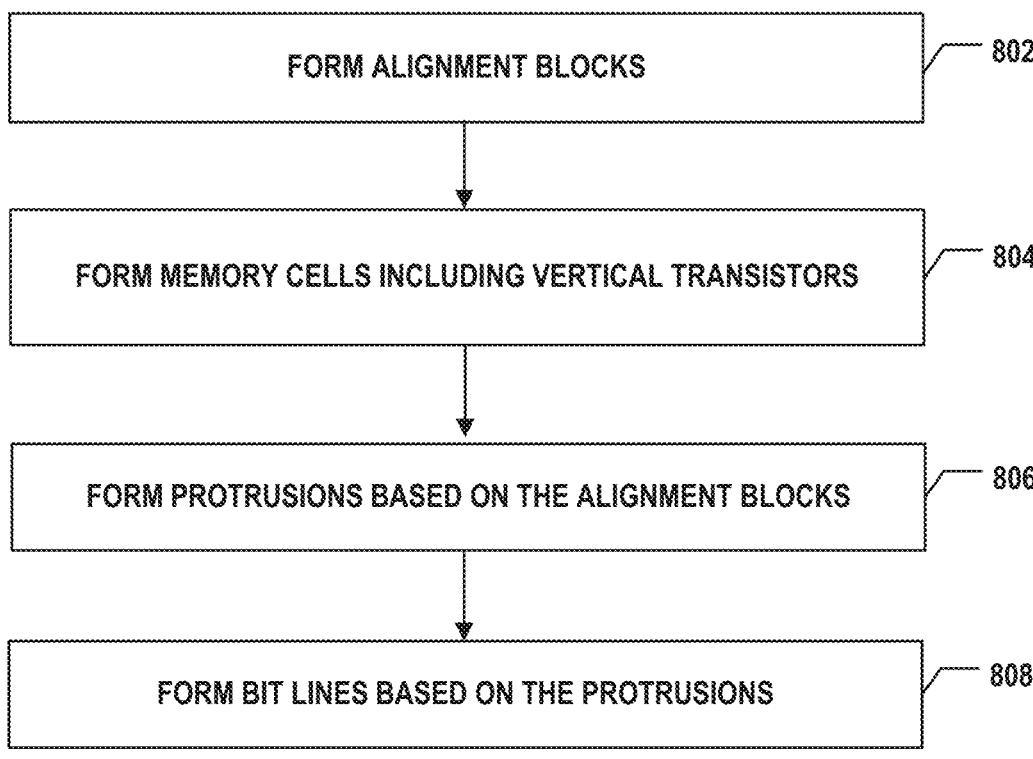

FIG. 8 illustrates a flowchart of an exemplary method for forming a 3D memory device having self-aligned bit lines, according to some aspects of the present disclosure.

FIGS. 9A-9F illustrate a schematic diagram of an exemplary fabrication process for forming a 3D memory device having self-aligned bit lines, according to some aspects of the present disclosure.

Figure 10:
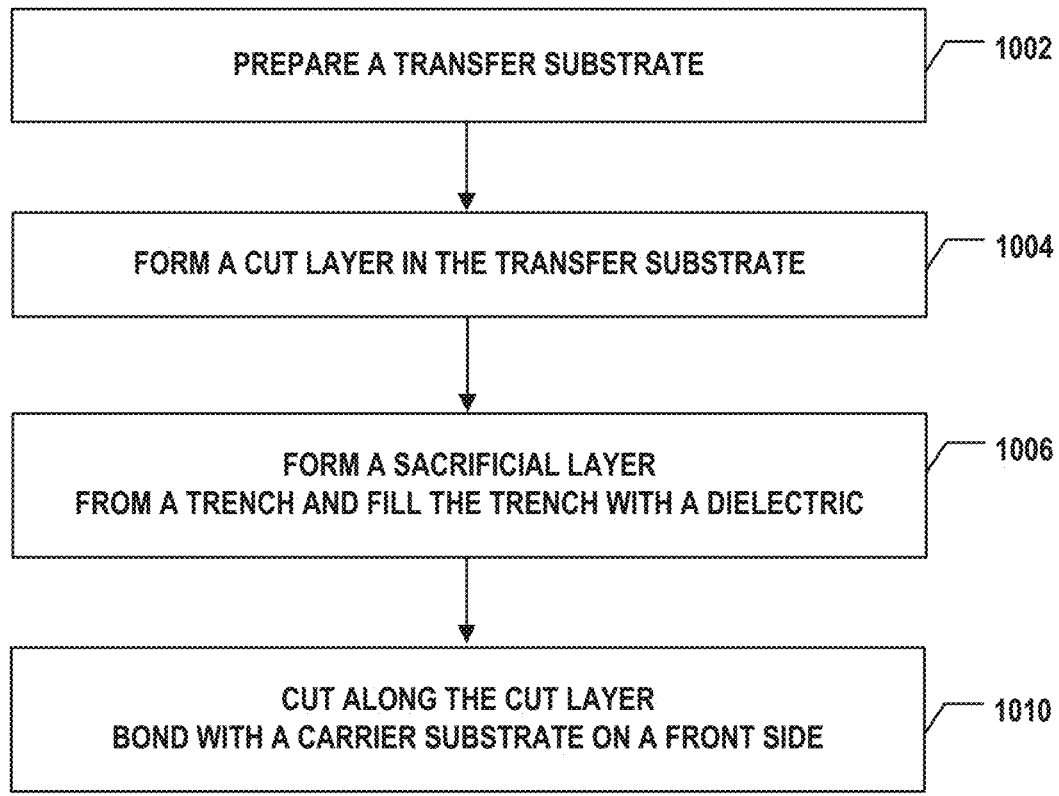

FIG. 10 illustrates a flowchart of an exemplary method for forming separation structures in a 3D memory device, according to some aspects of the present disclosure.

FIGS. 11A-11J illustrate a schematic diagram of an exemplary fabrication process for forming a 3D memory device having self-aligned bit lines, according to some aspects of the present disclosure.

FIGS. 12A-12D illustrate a schematic diagram of another exemplary fabrication process for forming a 3D memory device having self-aligned bit lines, according to some aspects of the present disclosure.

Figure 13:
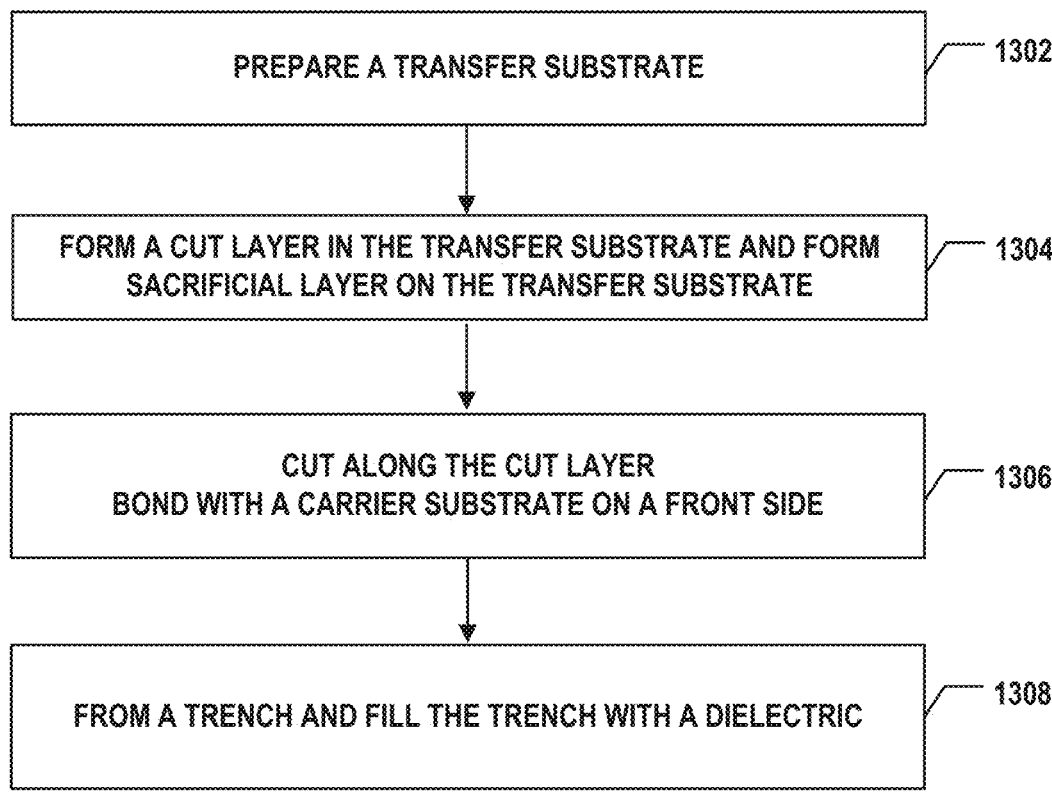

FIG. 13 illustrates a flowchart of another exemplary method for forming separation structures in a 3D memory device, according to some aspects of the present disclosure.

Figure 14A:
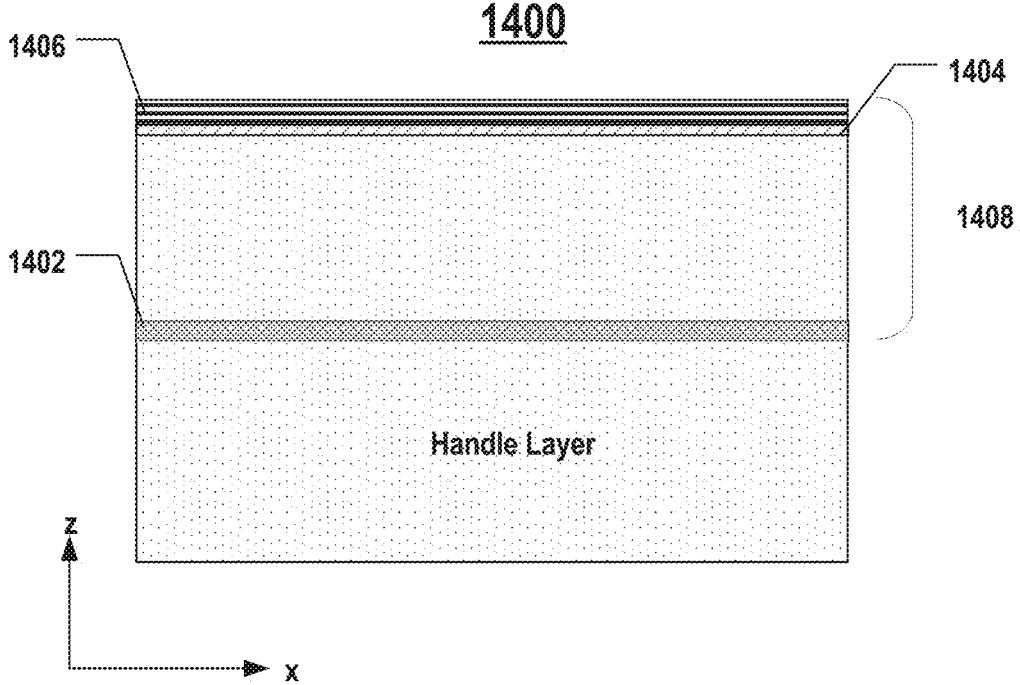
Figure 14A:
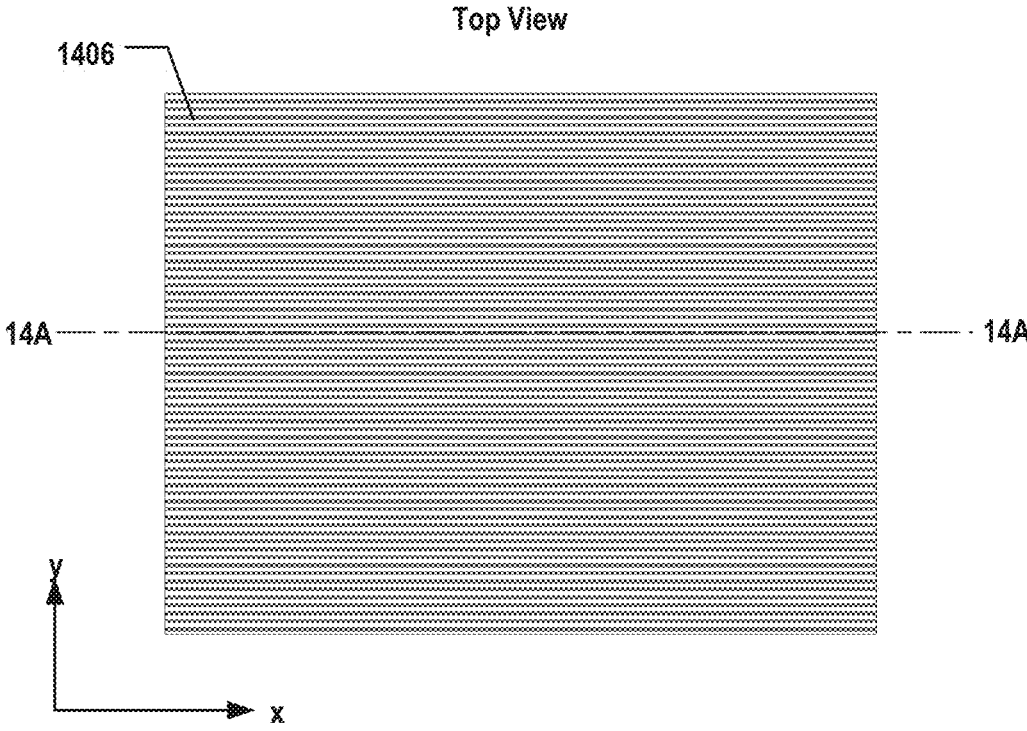
Figure 14B:
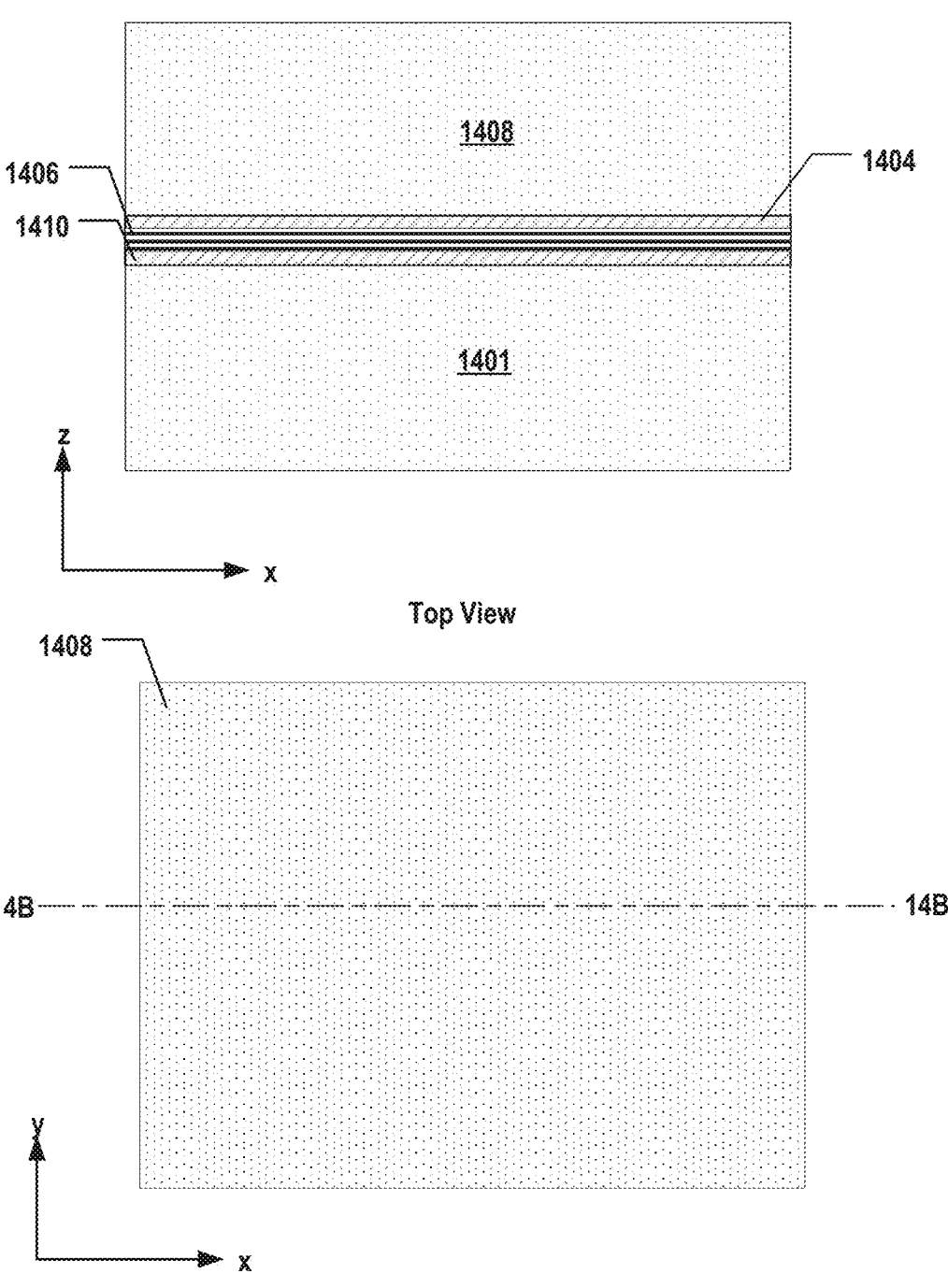
Figure 14C:
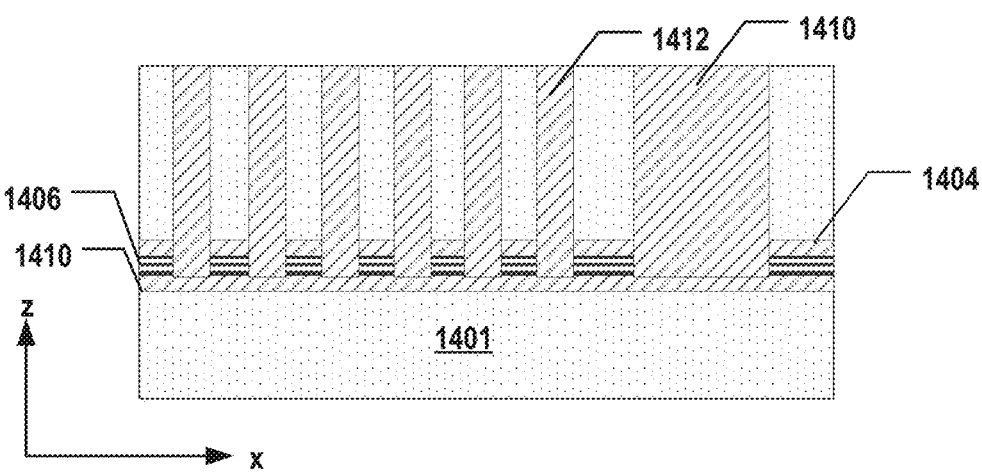
Figure 14C:
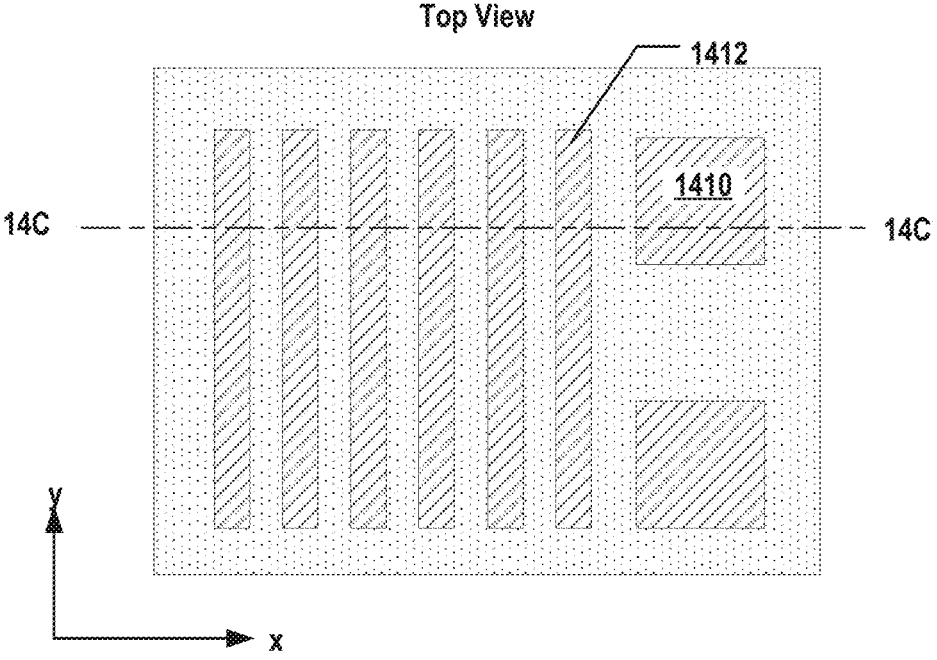

FIGS. 14A-14C illustrate a schematic diagram of still another exemplary fabrication process for forming separation structures in a 3D memory device, according to some aspects of the present disclosure.

Embodiments of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the terms "at least one" and "one or more" as used herein, depending at least in part upon context, may be used to describe any feature, structure, or characteristic in a singular sense or may be used to describe combinations of features, structures or characteristics in a plural sense. Similarly, terms, such as "a," "an,"

or "the," again, may be understood to convey a singular usage or to convey a plural usage, depending at least in part upon context. In addition, the terms "based on" and "according to" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, plastic, or sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors serve as the primary switch or selection devices in memory cells of certain memory devices, including DRAM. The planar transistors, however commonly utilized in current memory cells, possess a horizontal structure featuring buried word lines in a substrate and bit lines above it. This design results in the lateral placement of the source and drain of the transistor, which may increase the occupied area of the transistor. Additionally, the design of the planar transistor complicates the arrangement of interconnected structures, and the arrangement limits the pitches of the word and bit lines, increasing the fabrication complexity and decreasing the production yield.

Furthermore, in the architecture of some memory devices, such as DRAM, the drains of the memory cells are typically led out using a back-side process to form a series of bit lines. However, due to the wafer bonding process(es), the alignment of the back-side lithography may pose a significant challenge. Restricted by the performance requirements, conventional implantation techniques cannot be directly applied to the formation of bit lines. For example, the drains at the back side need to be activated using highly-doped polysilicon under high temperatures so as to connect with metal for forming the bit lines. This imposes stringent lithography alignment requirements. Moreover, wafer bonding processes can cause wafer deformation, leading to additional overlay residues and thus increasing the complexity of lithography alignments. The stress from the front layers may cause a certain degree of distortion of the patterns and deviation from the lithography mask. As a consequence, the effective process window for the lithography alignment decreases.

Figure 1:
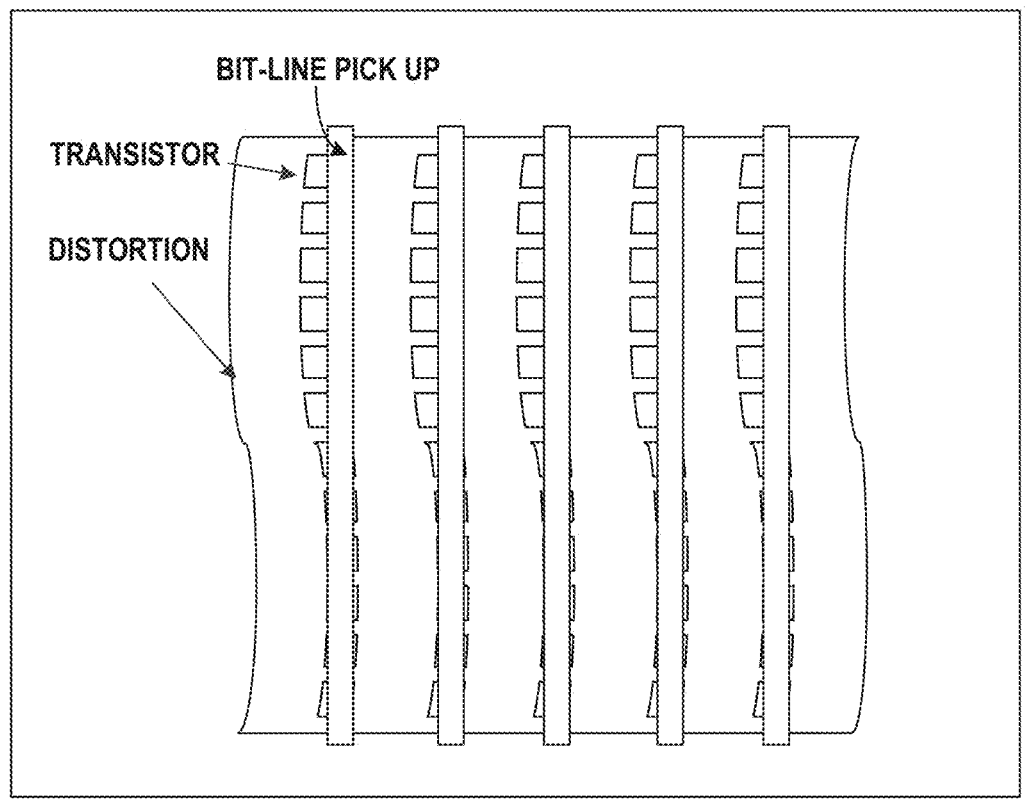
FIG. 1 illustrates the distortion of the memory cells in a memory device, leading to a breakdown of the memory device along a bit-line direction.

When the distortion exceeds a certain level, the drains of the memory cells may deviate from the metal for bit-line pickups, as shown in FIG. 1. The term "bit-line pickups" herein may refer to a process of locating and aligning the drains of the memory device to bond with the metal. The deviation may lead to a breakdown along the direction of the bit lines. Moreover, the memory cells in various locations may experience difference degrees of distortion, resulting in varying contact areas between the memory cells and the metal. As a result, different resistor-capacitor (RC) delays can arise from the memory cells, significantly impacting the uniformity of memory device performance.

To address one or more of the aforementioned issues, the present disclosure introduces a solution in which vertical transistors replace conventional planar transistors as the switch and selecting devices in a 3D memory cell array. Compared with planar transistors, the vertically-arranged transistors (i.e., the drain and source overlapping in the plan view) can reduce the area of the transistor as well as simplify the layout of the interconnect structures, thus reducing the fabrication complexity and improving the yield. The vertical structures of the transistors also allow the bit lines and storage units (such as capacitors) to be arranged at opposite sides of the transistors in the vertical direction (e.g., one above and one below the transistors), such that the process margin of the bit lines can be increased and the coupling capacitance between the bit lines and the storage units can be decreased.

Moreover, to address the deviation issues of the patterns, the present disclosure provides the 3D memory device with protrusions that allow self-alignment of the bit lines. Recesses can be formed between two of the protrusions and above the vertical transistors in the memory device. By utilizing the recesses, the positions of the bit lines can be easily located and accordingly formed. This solution eliminates the need for a lithography process for the bit-line pickups, which in turn increases the effective process window. Furthermore, this solution also eliminates the issue of the insufficient bit-line pickup overlay window introduced by the bonding processes. Ultimately, the proposed solution can simplify the process flow, reduce the cost, and eliminate the need for an additional lithography mask.

In the following, some implementations of the present disclosure are described with reference to the illustrations of the accompanying drawings that include FIGS. 2A-14C.

According to some aspects of the present disclosure, a memory cell that includes a memory cell array having vertical transistors may be introduced. The memory cell array and peripheral circuits of the memory cell array can be formed on different wafers and bonded together in a face-to-face manner. Thus, the thermal budget for fabricating the memory cell array does not affect the fabrication of the peripheral circuit. The stacked memory cell array and peripheral circuits can also reduce the chip size compared with the side-by-side arrangement, thereby improving the array efficiency. In some implementations, more than one memory cell array can be stacked over one another using bonding techniques to further increase the array efficiency. In some implementations, the word lines and bit lines may be arranged close to the bonding interface, which can be coupled to the peripheral circuits through a large number (e.g., millions) of parallel bonding contacts across the bonding interface that can make direct, short-distance (e.g., micron-level) electrical connections between the memory cell array and the peripheral circuits to increase the throughput and input/output (I/O) speed of the memory devices.

Figure 2A:
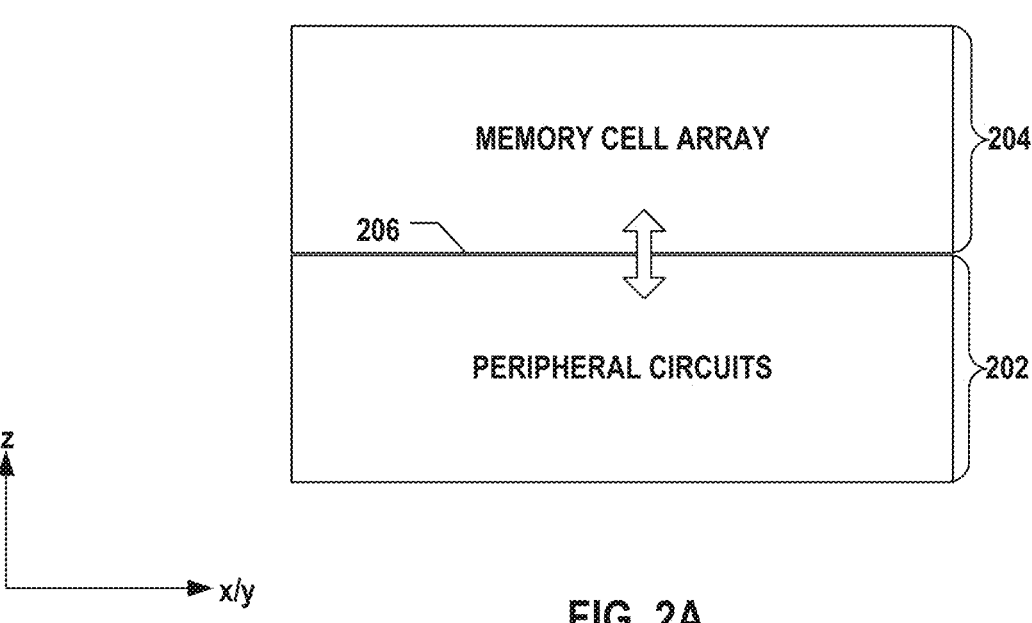
FIG. 2A illustrates a schematic view of a cross-section of a 3D memory device, according to some aspects of the present disclosure.

FIG. 2A illustrates a schematic view of a cross-section of a 3D memory device 200, according to some aspects of the present disclosure. 3D memory device 200 may represent an example of a bonded chip. The components of 3D memory device 200 (e.g., memory cell array and peripheral circuits) can be formed separately on different substrates and then combined to form a bonded chip. 3D memory device 200 can include a first semiconductor structure 202 that includes peripheral circuits of a memory cell array. In some implementations, 3D memory device 200 can also include a second semiconductor structure 204 that includes the memory cell array.

The peripheral circuits (or termed "control and sensing circuits") can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 202 can use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 2A, 3D memory device 200 can include first semiconductor structure 204 including an array of memory cells (memory cell array) that can use transistors as the switch and selecting devices. In some implementations, the memory cell array may include an array of DRAM cells. For ease of description, DRAM cell array is used as an example for describing the memory cell array in the present disclosure. But it can be understood that the memory cell array is not limited to DRAM cell array and may include any other suitable types of memory cell arrays that can use transistors as the switch and selecting devices, such as phase change memory (PCM) cell array, static random-access memory (SRAM) cell array, ferroelectric random access memory (FRAM) cell array, resistive memory cell array, magnetic memory cell array, spin transfer torque (STT) memory cell array, to name a few, or any combination thereof.

Second semiconductor structure 204 can be a DRAM device in which memory cells are provided in the form of an array of DRAM cells. In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuits in first semiconductor structure 202, according to some implementations.

As shown in FIG. 2A, 3D memory device 200 further includes a bonding interface 206 vertically between (in the vertical direction, e.g., the z-direction in FIG. 2A) first semiconductor structure 202 and second semiconductor structure 204. As described below in detail, first and second semiconductor structures 202 and 204 can be fabricated separately (and in parallel in some implementations) such that the thermal budget for fabricating one of first and second semiconductor structures 202 and 204 does not limit the processes of fabricating another one of first and second semiconductor structures 202 and 204. Moreover, a large number of interconnects (e.g., bonding contacts) can be formed through bonding interface 206 to make direct, short-distance (e.g., micron-level) electrical connections between first semiconductor structure 202 and second semiconductor structure 204, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 204 and the peripheral circuits in first semiconductor structure 202 can be performed through the interconnects (e.g., bonding contacts) across bonding interface 206. By vertically integrating first and second semiconductor structures 202 and 204, the chip size can be reduced, and the memory cell density can be increased.

Figure 2B:
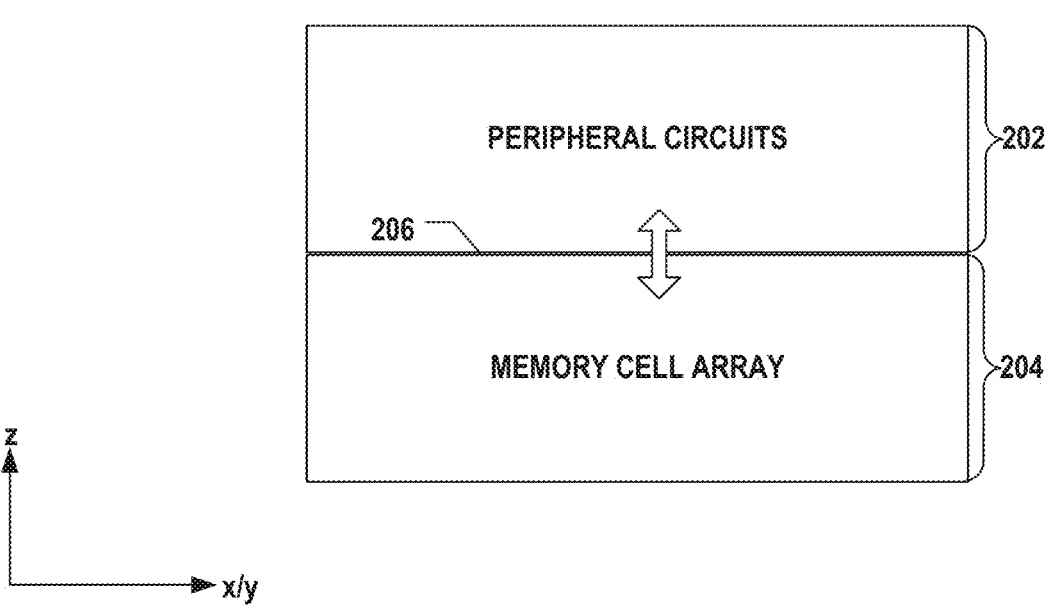
FIG. 2B illustrates a schematic view of a cross-section of another 3D memory device, according to some aspects of the present disclosure.

It can be understood that the relative positions of stacked first and second semiconductor structures 202 and 204 are not limited. Therefore, FIG. 2B illustrates a schematic view of a cross-section of another exemplary 3D memory device 201, according to some implementations. Different from 3D memory device 200 in FIG. 2A in which second semiconductor structure 204 including the memory cell array is above first semiconductor structure 202 including the peripheral circuits, in 3D memory device 201 in FIG. 2B, first semiconductor structure 202 including the peripheral circuits is above second semiconductor structure 204 including the memory cell array. Nevertheless, bonding interface 206 is formed vertically between first and second semiconductor structures 202 and 204 in 3D memory device 201, and first and second semiconductor structures 202 and 204 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 204 and the peripheral circuits in first semiconductor structure 202 can be performed through the interconnects (e.g., bonding contacts) across bonding interface 206.

It is noted that x, y, and z axes are included in FIGS. 2A and 2B to further illustrate the spatial relationship of the components in 3D memory devices 200 and 201. The substrate of the 3D memory device may include two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes.

As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing spatial relationships is applied throughout the present disclosure. Further, in the description of the present disclosure, the term "depth" may be used to indicate a distance or length from the top or bottom surface of one reference item (e.g., a substrate) along the z-direction.

FIG. 3 illustrates a schematic diagram of an exemplary system 300 having a memory device, according to some aspects of the present disclosure. System 300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 3, system 300 can include a host 302 and a memory system 304 having one or more memory devices 306 and a memory controller 308. Host 302 can be a processor of an electronic device, such as a central processing unit (CPU), or a system-on-chip (SoC), such as an application processor (AP). Host 302 can be configured to send or receive the data to or from memory device 306.

Memory device 306 can be any memory devices disclosed herein, such as 3D memory devices 200 and 201. In some implementations, memory device 306 can include an array of memory cells each including a vertical transistor and can further include self-aligned bit-lines formed between two protrusions and above the vertical transistors in the memory device, as described below in detail.

Memory controller 308 can be coupled to memory device 306 and host 302 and may be configured to control memory device 306, according to some implementations. Memory controller 308 can manage the data stored in memory device 306 and communicate with host 302. Memory controller 308 can be configured to control operations of memory device 306, such as read, write, and refresh operations. Memory controller 308 can also be configured to manage various functions with respect to the data stored or to be stored in memory device 306 including, but not limited to refresh and timing control, command/request translation, buffer and schedule, and power management.

In some implementations, memory controller 308 can be further configured to determine the maximum memory capacity that the computer system can use, the number of memory banks, memory type and speed, memory particle data depth and data width, and other important parameters. Memory controller 308 may perform any other suitable functions as well. Memory controller 308 can communicate with an external device (e.g., host 302) according to a particular communication protocol. For example, memory controller 308 may communicate with the external device through at least one of various interface protocols, such as a universal serial bus (USB) protocol, a multi-media card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

FIG. 4 illustrates a schematic diagram of an exemplary memory device 400 including peripheral circuits and an array of memory cells each having a vertical transistor, according to some aspects of the present disclosure. Memory device 400 can include a memory cell array 401 and peripheral circuits 402 coupled to memory cell array 401. 3D memory devices 200 and 201 may be examples of memory device 400 in which memory cell array 401 and peripheral circuits 402 may be included in first and second semiconductor structures 202 and 204, respectively. Memory cell array 401 can be any suitable memory cell array in which each memory cell 408 may include a vertical transistor 410 and a storage unit 412 coupled to vertical transistor 410. In some implementations, memory cell array 401 may be a DRAM cell array, and storage unit 412 may be a capacitor for storing charge as the binary information stored by the respective DRAM cell. It can also be understood that memory cell array 401 may be implemented in another format (such as a PCM cell array), and storage unit 412 may be implemented in a corresponding format (such as a PCM element).

As shown in FIG. 4, memory cells 408 can be arranged in a two-dimensional (2D) array having rows and columns. Memory device 400 can include word lines 404 coupling peripheral circuits 402 and memory cell array 401 for controlling the switch of vertical transistors 410 in memory cells 408 located in a row, as well as bit lines 406 coupling peripheral circuits 402 and memory cell array 401 for sending data to and/or receiving data from memory cells 408 located in a column. That is, each word line 404 is coupled to a respective row of memory cells 408, and each bit line is coupled to a respective column of memory cells 408.

Consistent with the scope of the present disclosure, vertical transistors 410, such as vertical metal-oxide-semiconductor field-effect transistors (MOSFETs), can replace the conventional planar transistors as the pass transistors of memory cells 408 to reduce the area occupied by the pass transistors, the coupling capacitance, as well as the interconnect routing complexity. As shown in FIG. 4, in some implementations, different from planar transistors in which the active regions are formed in the substrates, vertical transistor 410 may include a semiconductor body 414 extending vertically (in the z-direction) above the substrate (not shown in FIG. 4). That is, semiconductor body 414 can extend above the top surface of the substrate to expose not only the top surface of semiconductor body 414, but also one or more side surfaces thereof. As shown in FIG. 4, for example, semiconductor body 414 can have a cuboid shape to expose four sides thereof.

It can be understood, however, that semiconductor body 414 may have any suitable 3D shape, such as polyhedron shapes or cylinder shapes. That is, the cross-section of semiconductor body 414 in the plan view (e.g., in the x-y plane) can have a square shape, a rectangular shape (or a trapezoidal shape), a circular (or an oval shape), or any other suitable shapes. It can also be understood that consistent with the scope of the present disclosure, for semiconductor bodies that have a circular or oval shape of their cross-sections in the plan view, the semiconductor bodies may still be considered to have multiple sides, such that the gate structures are in contact with more than one side of the semiconductor bodies.

As shown in FIG. 4, vertical transistor 410 can also include a gate structure 416 in contact with one or more sides of semiconductor body 414, i.e., in one or more planes of the side surface(s) of the active region. In other words, the active region of vertical transistor 410, i.e., semiconductor body 414, can be at least partially surrounded by gate structure 416. Gate structure 416 can include a gate dielectric 418 over one or more sides of semiconductor body 414, e.g., in contact with four side surfaces of semiconductor body 414, as shown in FIG. 4. Gate structure 416 can also include a gate electrode 420 over and in contact with gate dielectric 418.

Gate dielectric 418 can include any suitable dielectric materials, such as silicon oxide, silicon nitride, silicon oxynitride, or high-k dielectric materials. For example, gate dielectric 418 may include silicon oxide, i.e., gate oxide. Gate electrode 420 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 420 may include doped polysilicon, i.e., a gate poly. In some implementations, gate electrode 420 includes multiple conductive layers, such as a W layer over a TiN layer. It can be understood that gate electrode 420 and word line 404 may be a continuous conductive structure in some examples. In other words, gate electrode 420 may be viewed as part of word line 404 that forms gate structure 416, or word line 404 may be viewed as the extension of gate electrode 420 to be coupled to peripheral circuits 402.

As shown in FIG. 4, vertical transistor 410 can further include a pair of a source and a drain (S/D, dope regions, a.k.a., source electrode and drain electrode) formed at the two ends of semiconductor body 414 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 416 in the vertical direction (the z-direction). In other words, gate structure 416 can be formed vertically between the source and drain. As a consequence, one or more channels (not shown) of vertical transistor 410 can be formed in semiconductor body 414 vertically between the source and drain when a gate voltage applied to gate electrode 420 of gate structure 416 can be above the threshold voltage of vertical transistor 410. That is, each channel of vertical transistors 410 can also be formed in the vertical direction along which semiconductor body 414 extends, according to some implementations.

In some implementations, as shown in FIG. 4, vertical transistor 410 can be a multi-gate transistor. That is, gate structure 416 can be in contact with more than one side of semiconductor body 414 (e.g., four sides in FIG. 4) to form more than one gate, such that more than one channel can be formed between the source and drain in operation. In some implementations, the multi-gate vertical transistors can include double-gate vertical transistors (e.g., dual-side gate vertical transistors), tri-gate vertical transistors (e.g., tri-side gate vertical transistors), and gate-all-around (GAA) vertical transistors.

It can be understood that although vertical transistor 410 is shown as a multi-gate transistor (i.e., GAA transistors) in FIG. 4, the vertical transistors disclosed herein can be single-gate transistors. That is, gate structure 416 may be in contact with a single side of semiconductor body 414, for example, for the purpose of increasing the transistor and memory cell density. It is also understood that although gate dielectric 418 is shown as being separate from other gate dielectric materials of adjacent vertical transistors (not shown), gate dielectric 418 may be part of a continuous dielectric layer having multiple gate dielectric materials of vertical transistors. In some implementations, the source and the drain are formed at two ends of semiconductor body 414 in the vertical direction (the z-direction), respectively, thereby overlapping in the plan view. Also, the metal wiring coupled to vertical transistors 410 can be simplified as well since the interconnects can be routed in different planes. For example, bit lines 406 and storage units 412 may be formed on opposite sides of vertical transistor 410. In one example, bit line 406 may be coupled to the drain at the upper end of semiconductor body 414, while storage unit 412 may be coupled to the source at the lower end of semiconductor body 414.

As shown in FIG. 4, storage unit 412 can be coupled to the source of vertical transistor 410. Storage unit 412 can include any devices that are capable of storing binary data (e.g., 0 and 1), including but not limited to, capacitors for DRAM cells and FRAM cells, and PCM elements for PCM cells. In some implementations, vertical transistor 410 can control the selection and/or the state switch of respective storage unit 412 coupled to vertical transistor 410. FIG. 5 illustrates a schematic circuit diagram of an exemplary memory device 500 including peripheral circuits and an array of dynamic random-access memory (DRAM) cells, according to some aspects of the present disclosure. In some implementations as shown in FIG. 5, each memory cell 408 in FIG. 4 may be a DRAM cell 502 including a transistor 504 (e.g., implementing using vertical transistors) and a capacitor 506 (e.g., an example of storage unit 412 in FIG. 4). The gate of transistor 504 (e.g., corresponding to gate electrode 420) may be coupled to word line 404, the drain of transistor 504 may be coupled to bit line 406, the source of transistor 504 may be coupled to one electrode of capacitor 506, and the other electrode of capacitor 506 may be coupled to a low potential, such as the ground.

Peripheral circuits 402 can be coupled to memory cell array 401 through bit lines 406, word lines 404, and any other suitable metal wirings. As described above, peripheral circuits 402 can include any suitable circuits for facilitating the operations of memory cell array 401 by applying and sensing voltage signals and/or current signals through word lines 404 and bit lines 406 to and from each memory cell 408, as shown in FIG. 4. Peripheral circuits 402 can include various types of peripheral circuits formed using CMOS technologies.

FIG. 6 illustrates a plan view of an exemplary array of memory cells 602 each including a vertical transistor in a memory device 600, according to some aspects of the present disclosure. As shown in FIG. 6, memory device 600 can include a plurality of word lines 604 each extending in a lateral direction (the x-direction, referred to as the word-line direction). Memory device 600 can also include a plurality of bit lines 606 each extending in another lateral direction (the y-direction, referred to as the bit-line direction) perpendicular to the lateral direction.

FIG. 6 illustrates an example of an array of memory cells 408 in FIG. 4. Memory cells 602 in FIG. 6 can be formed at the intersections of word lines 604 and bit lines 606, while in some implementations, memory cells may not be formed at the intersections of word lines and bit lines. In some implementations, each memory cell 602 includes a vertical transistor (e.g., vertical transistor 410 in FIG. 4) having a semiconductor body 608 and a gate structure 610. Semiconductor body 608 can extend in the vertical direction (the z-direction, not shown) perpendicular to the first and second lateral directions (the x and y-directions).

As shown in FIG. 6, in some implementations, the vertical transistor can be a multi-gate transistor in which the gate structure is in contact with a plurality of sides (e.g., all four sides) of semiconductor body (the active region in which channels are formed). Gate structure 610 can include a gate dielectric 612 fully circumscribes semiconductor body 608 in the plan view, and a gate electrode 614 fully circumscribes gate dielectric 612. In some implementations, gate dielectric 612 is laterally between gate electrode 614 and semiconductor body 608 in the bit-line direction and in the word-line direction. It can also be understood that FIG. 6 merely illustrates an exemplary implementation of the vertical transistors. In other implementations, the vertical transistors can include tri-gate transistors or double-gate transistors. In other implementations, the vertical transistors disclosed herein can include single-gate transistors (a.k.a. single-side gate transistors) in a mirror-symmetric arrangement with respect to adjacent transistors in the bit-line direction as a result of splitting multi-gate transistors (e.g., double-gate transistors) using trench isolations extending along the word-line direction. The present disclosure does not place limitations thereto.

In accordance with the scope of the present disclosure, the array of memory device 600 may further include a plurality of separation structures 616. Each of separation structures 616 may include a protrusion, and along the word-line direction (i.e., the x-direction in FIG. 6), vertical transistors (such as 410 in FIG. 4) of memory cells 602 may be arranged in respective recesses, each of which may be formed between two of the protrusions in the plan view. Each separation structure 616 and its corresponding protrusion are integral, and the term "integral" may be used to describe that each separation structure 616 and its protrusion may be based on the same structure, and in some examples, they may include substantially the same material(s). The plan view may be based on a first plane (e.g., the x-z plane) defined along the word-line direction. Accordingly, the formation of bit lines 606 can be easily located with respect to the recesses, and bit lines 606 can be formed in the recesses.

In some implementations, the protrusions may continuously extend in the bit-line direction (i.e., the y-direction) as shown in FIG. 6, while in other implementations, the protrusions may be separated by, e.g., trench isolation, and may be discontinuous. It can also be understood that FIG. 6 does not illustrate a cross-section of memory device 600 in the same lateral plane, and word lines 604 and bit lines 606 may be formed in different lateral planes for ease of routing.

FIG. 7 illustrates a perspective view schematically showing an exemplary 3D memory device 700 including protrusions for forming self-aligned bit lines, according to some aspects of the present disclosure. In 3D memory device 700, a bit line 702, at least in part, may be formed in a recess 704 between two protrusions 706 and on vertical transistors 708 of a column. Bit line 702 may be in contact with the drains of vertical transistors 708 to couple bit line 702 with vertical transistors 708 in recess 704 along the bit-line direction (i.e., the y-direction in FIG. 7). Each protrusion 706 may be formed on a corresponding separation structure 712. Recess 704 and protrusion 706 can provide a self-alignment mechanism for forming bit lines 702. In some implementations, the projection of bit line 702, arranged between two protrusions

706, on a second plane (e.g., the x-y plane) may not overlap with the projection of each of the two separation structures on the second plane. The second plane perpendicular to the first plane (e.g., the x-z plane) is defined according to the word-line direction. A plurality of world lines 710 may be formed along the second lateral direction.

Through this manner, the issues in the known art can be addressed (such as the effective process window can be increased, and the issue of the insufficient bit-line pickup overlay window introduced by the bonding process can be eliminated). In order to indicate the locations of vertical transistors 708 in FIG. 7, separation structures 712 and protrusions 706 are depicted in broken lines, but it can be understood that, in some implementations, they may continuously extend in the bit-line direction, as shown in FIG. 6.

Figure 9A:
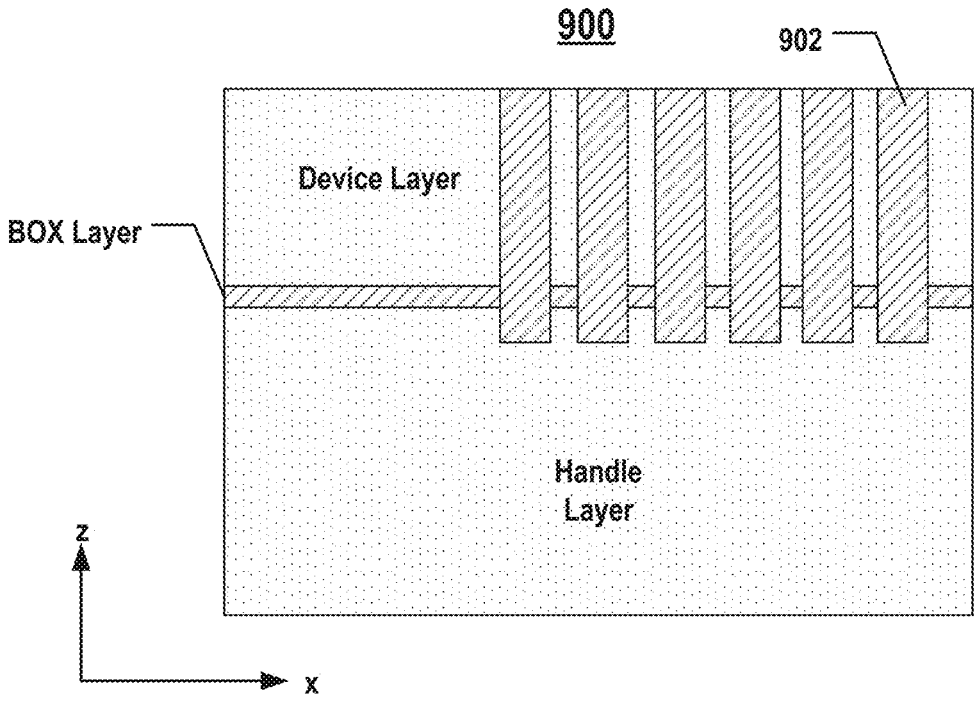
Figure 9A:
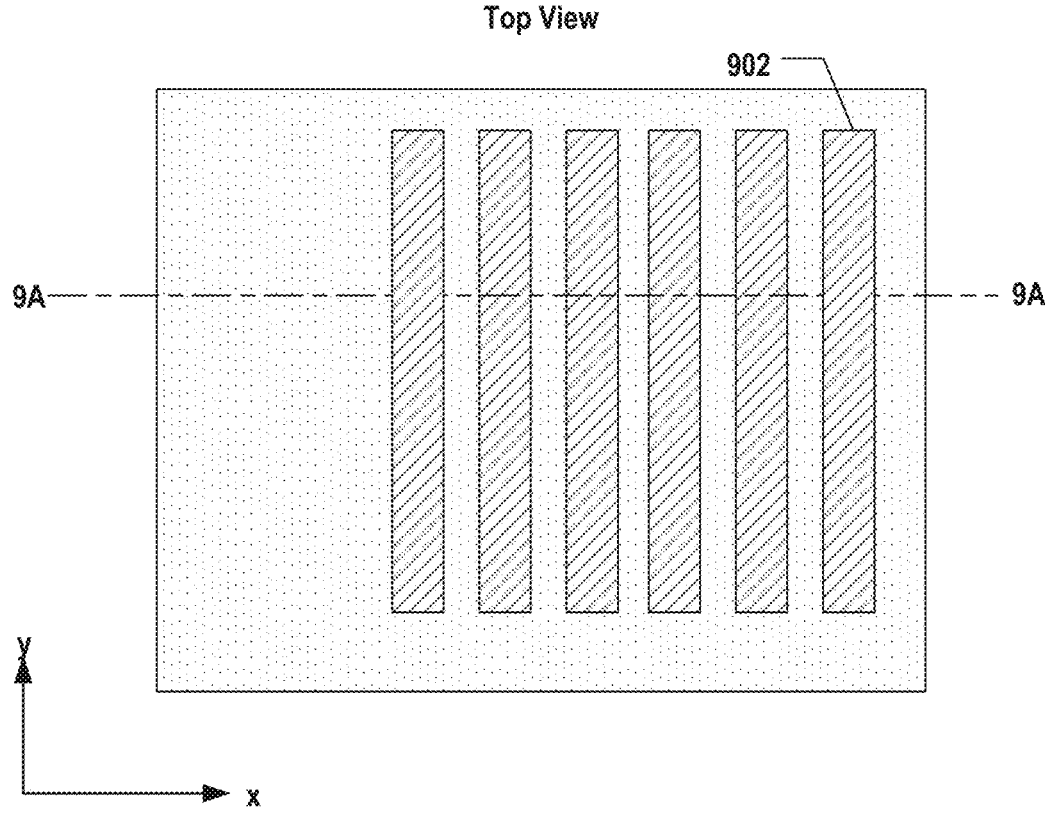

FIG. 8 illustrates a flowchart of an exemplary method 800 for forming a 3D memory device having self-aligned bit lines, according to some aspects of the present disclosure. Method 800 proceeds to 802, where a plurality of separation structures may be formed. Each of the separation structures may be processed to form protrusions 706 in FIG. 7 for the alignment of bit lines 702. At 802, a substrate 900 may be prepared. Substrate 900 can be a silicon-on-insulator (SOI) substrate that includes a handle layer, a device layer, and a buried oxide (BOX) layer between the device layer and the handle layer, as shown in FIG. 9A. The term "device layer" may be used to describe that semiconductor components are formed in or within this layer.

In some implementations, substrate 900 may be a silicon substrate, such that each of the device layer and handle layer may contain silicon, while the BOX layer may contain silicon oxide and function as an insulating layer. In some implementations, to form separation structures 712 as shown in FIG. 7, a first portion of the handler layer and the device layer may be respectively removed (e.g., by etching), e.g., through the BOX layer, along a first lateral direction (the y-direction, referred to as the bit-line direction) to form trenches (not shown). In some embodiments, each trench may continuously extend along the first lateral direction and include a depth by extending vertically from the top surface of the device layer to enter the handle layer. Afterward, the trenches may be filled with a dielectric material, such as silicon oxide. As a result, separation structures 902 extending in the first lateral direction can be formed in substrate 900, as shown in FIG. 9A.

Figure 9B:
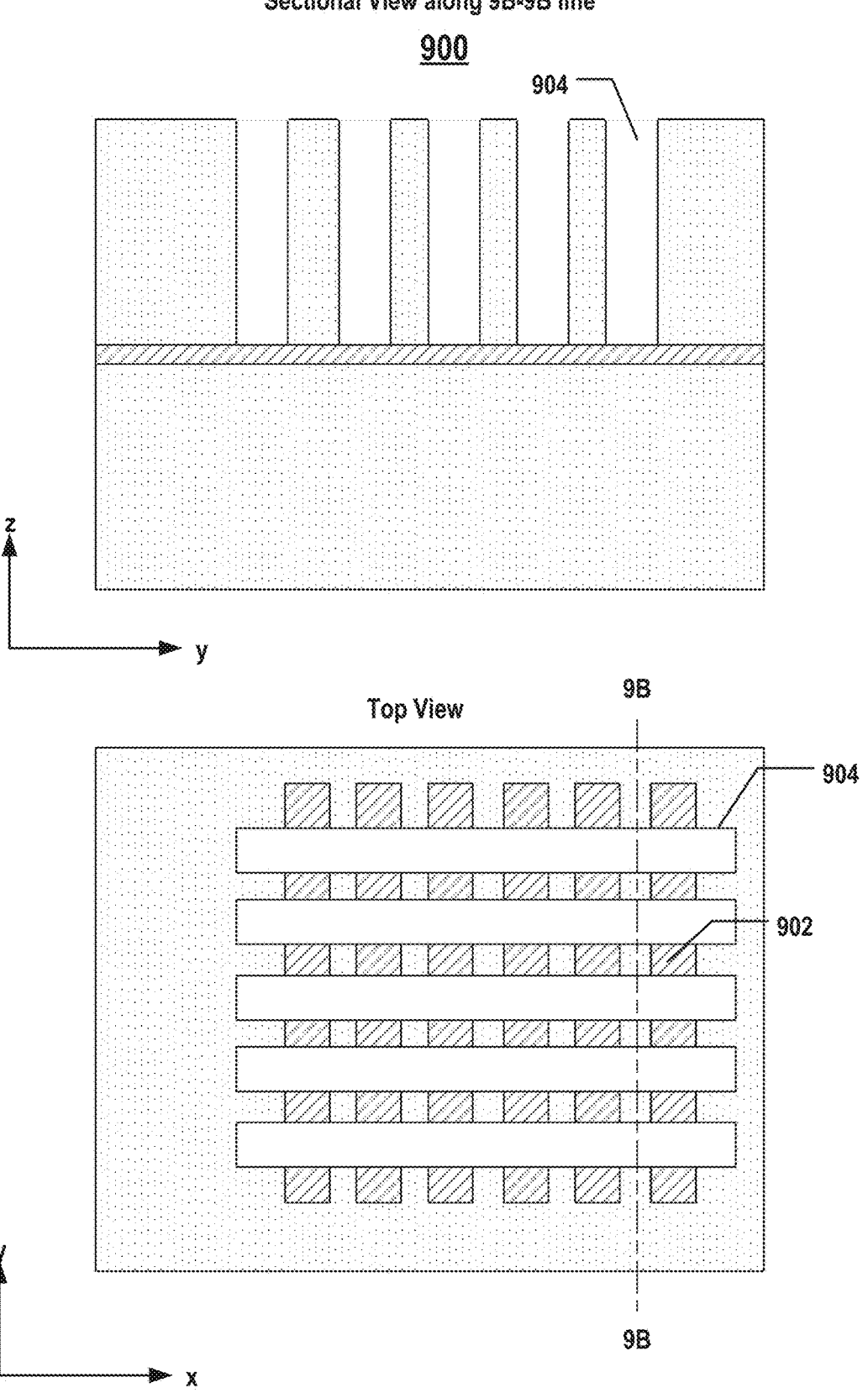

Method 800 may proceed to 804. At 804, a plurality of memory cells (e.g., memory cells 602 in FIG. 6) may be formed. Each of the memory cells may include a vertical transistor. In some implementations, to form the vertical transistors and other suitable components (such as word lines), a second portion of the handler layer may be respectively removed (e.g., etching from a front side) along a second lateral direction to form trenches 904, as shown in FIG. 9B. In some implementations, each trench 904 may continuously extend along the second lateral direction and include a depth by extending vertically from the top surface of the device layer until reaching the BOX layer. In other words, the BOX layer may function as a stop layer in this process. As a result, the depth of trench 904 may be less than the depth of the trench for forming separation structures 902 in FIG. 9A. In the present disclosure, the second later direction may be equivalent to the x-direction and referred to as the word-line direction.

Figure 9C:
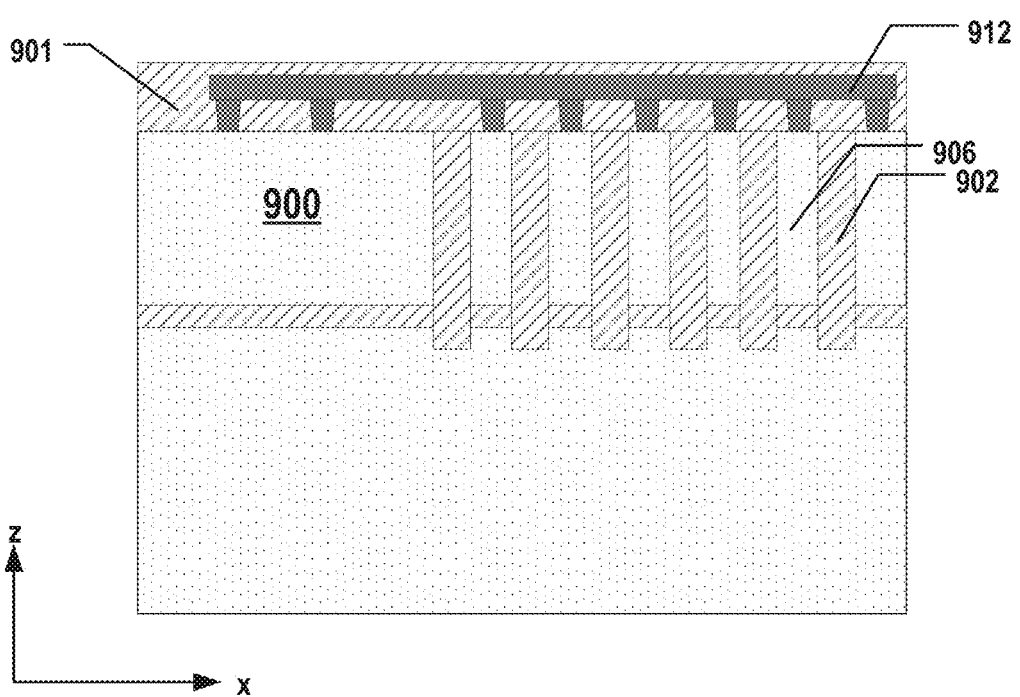
Figure 9C:
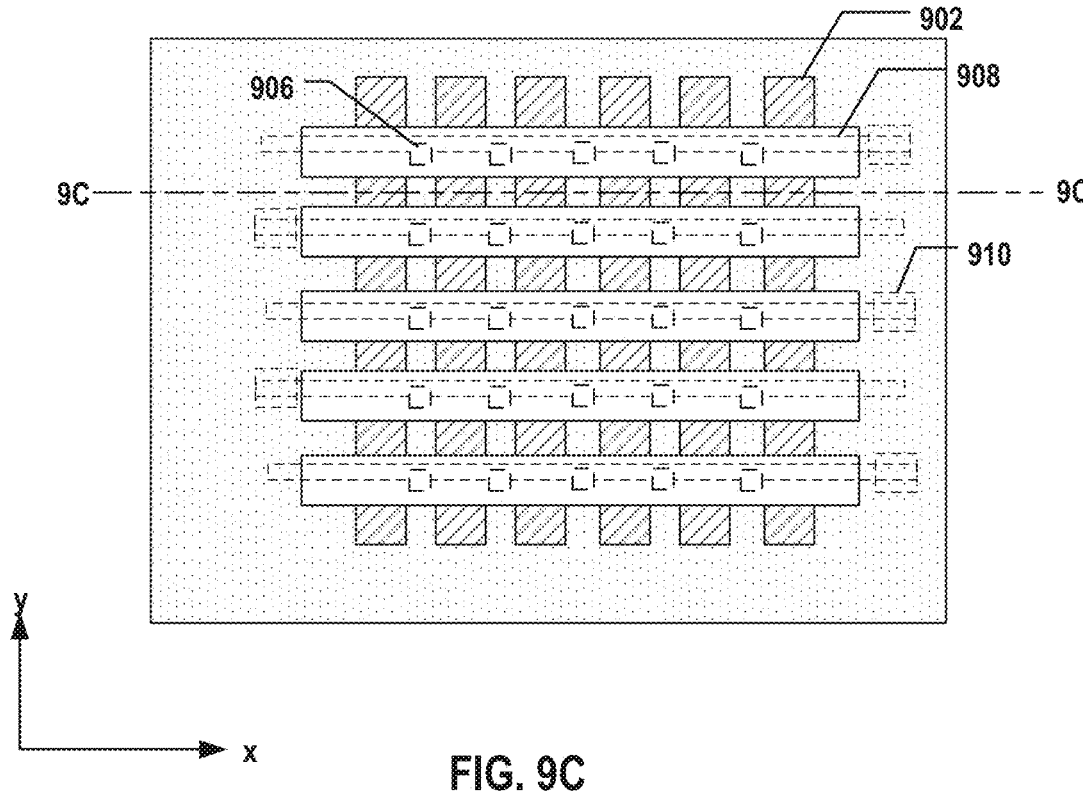

In some implementations, as shown in FIG. 9C, vertical transistors 906, at least in part, may be formed in trenches 904. Each vertical transistor 906 may include a semiconductor body, a gate structure, a source, and a drain (not shown), as described above. In some implementations, the semiconductor body can be epitaxially grown from substrate 900 in a respective trench 904. The fabrication processes for epitaxially growing the semiconductor body can include, but are not limited to, vapor phase epitaxy (VPE), liquid phase epitaxy (LPE), molecular mean epitaxy (MPE), or any combinations thereof. The semiconductor body thus can have the same material as substrate 900. In some implementations, doped regions can be formed in substrate 900 by ion implantation and/or thermal diffusion, which may function, for example, as the source and drain of vertical transistor 906. Vertical transistors 906 in FIG. 9C may be provided as an exemplary implementation of vertical transistors 410 in FIG. 4.

Consistent with the scope of the present disclosure, each vertical transistor 906 may be formed between two separation structures 902 in the top plan view (e.g., the x-y plane) and in the sectional plan view (e.g., the x-z plane), as shown in FIG. 9C. In some implementations, word lines 908 may be formed in trenches 904, and word-line contacts 910 may be formed. Word lines 908 may be connected with gate electrodes of vertical transistors 906 of one row, while word-line contacts 910 may be coupled with and controlled by peripheral circuits 402 in FIG. 4.

In some implementations, storage units (e.g., capacitors) and source lines 912 connected with vertical transistors 906 may be formed. The capacitors may be an exemplary implementation of storage units 412 in FIG. 4. In some implementations, one or more interlayer dielectric (ILD) layers 901 may be formed over the top surface of substrate 900, for example, by depositing dielectric materials using one or more thin film deposition processes including, but not limited to, chemical vapor deposition (CVD), physical vapor deposition (PVD), atomic layer deposition (ALD), or any combination thereof. In some examples, the dielectric material of ILD layers 901 may include silicon oxide. Electrodes and capacitor dielectrics can be subsequently formed in ILD layers 901 to function as the capacitors in contact with vertical transistors 906 (e.g., the source of vertical transistors 906). In some implementations, each of the electrodes can be formed on a respective source by patterning and etching an electrode hole aligned with the respective source using lithography, etching processes, and depositing conductive materials to fill the electrode hole using thin film deposition processes. In some implementations, word lines and source lines can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, source lines may include tungsten (W).

In some examples, suitable portions of trenches 904 may be filled with a dielectric material, for example, silicon oxide, such that word lines 908 can be electrically insulated from the bit lines formed later. Overall, vertical transistors 906 may be formed by a series of processes including, but not limited to, photolithography, dry/wet etch, thin film deposition, thermal growth, implantation, a planarization process (e.g., chemical mechanical planarization, CMP), and any other suitable processes.

Method 800 may proceed to 806. At 806, substrate 900 may be processed to form a protrusion on each separation structure at one end thereof. In some implementations, a carrier substrate 903 (i.e., a handle substrate) may be bonded onto the front side of substrate 900 to form a semiconductor structure 905 using any suitable bonding processes, such as anodic bonding, fusion bonding, transfer bonding, adhesive bonding, and eutectic bonding. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. As used herein, the term "front side" of substrate 900 may refer to the side with the active layer (i.e., the device layer) of the substrate.

Figure 9D:
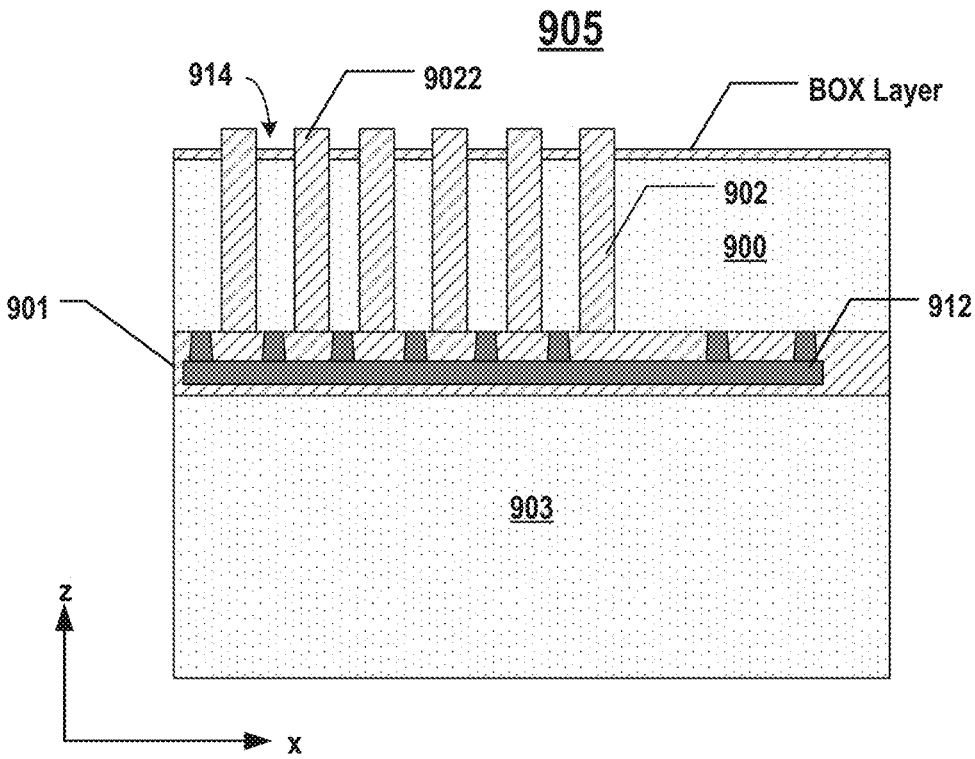
Figure 9D:
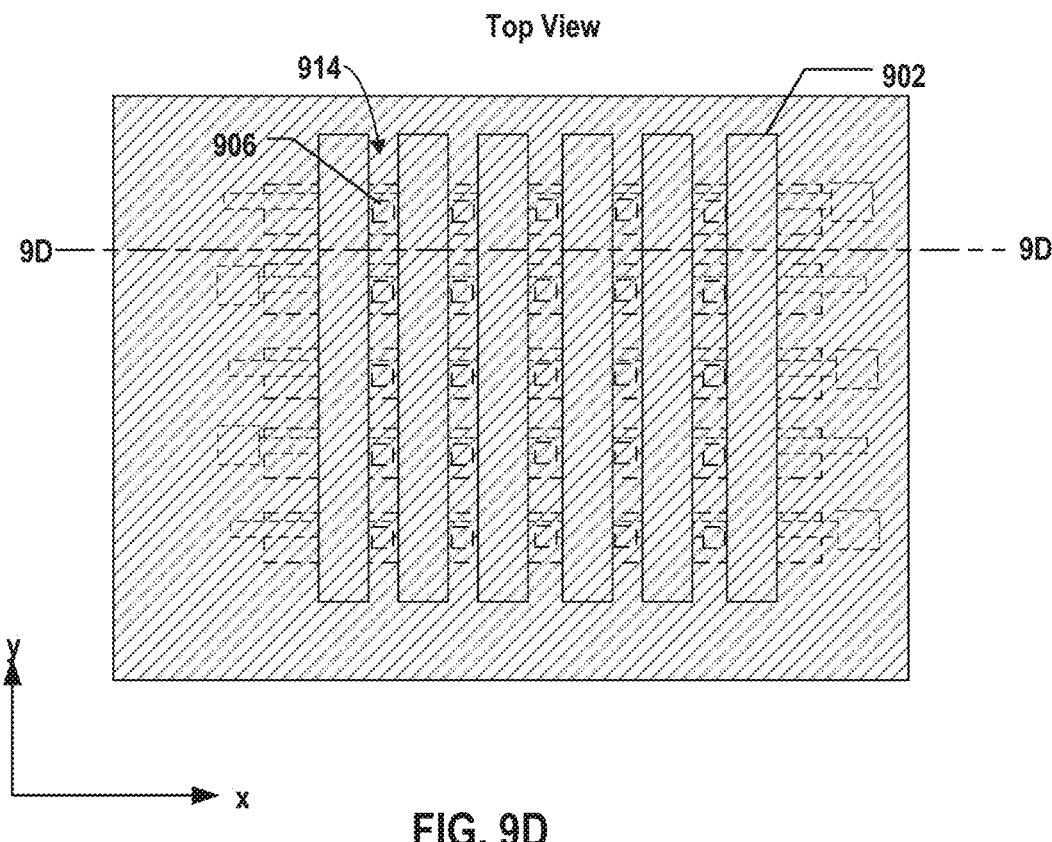

After the bonding, semiconductor structure 905 can then be flipped upside down, and substrate 900 may become above carrier substrate 903. Subsequently, the top surface of semiconductor structure 905 (i.e., the handle layer of substrate 900 on the back side) may be removed to expose the BOX layer, as shown in FIG. 9D. In some implementations, the BOX layer can function as a stop layer in planarization and/or etching processes, and the planarization processes (e.g., CMP) and/or the etching processes may be performed to remove the handle layer of substrate 900 until being stopped by the BOX layer. Through this manner, one end of each separation structure 902 may be exposed to form a protrusion 9022, and the remaining portion of separation structure 902 may still remain in substrate 900. As a consequence, recesses 914 can be formed between two protrusions 9022. In some implementations, protrusions 9022 may protrude, relative to the BOX layer, in the z-direction, and recess 914 may continuously extend in the first lateral direction (the y-direction; a.k.a. the bit-line direction), as shown in FIG. 9D. In some implementations, vertical transistors 906 may be arranged below recesses 914. As used herein, the term "protrusion" may refer to a portion that sticks out from the neighboring surface (e.g., the BOX layer), while the term "recess" may indicate a portion that is set back than its adjacent portion.

Figure 9E:
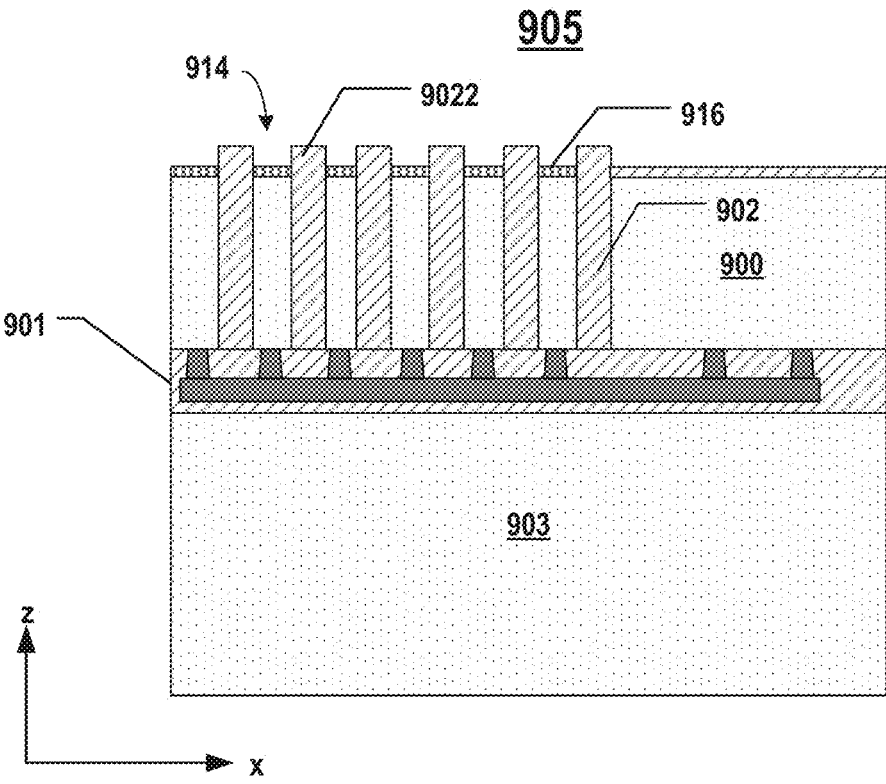
Figure 9E:
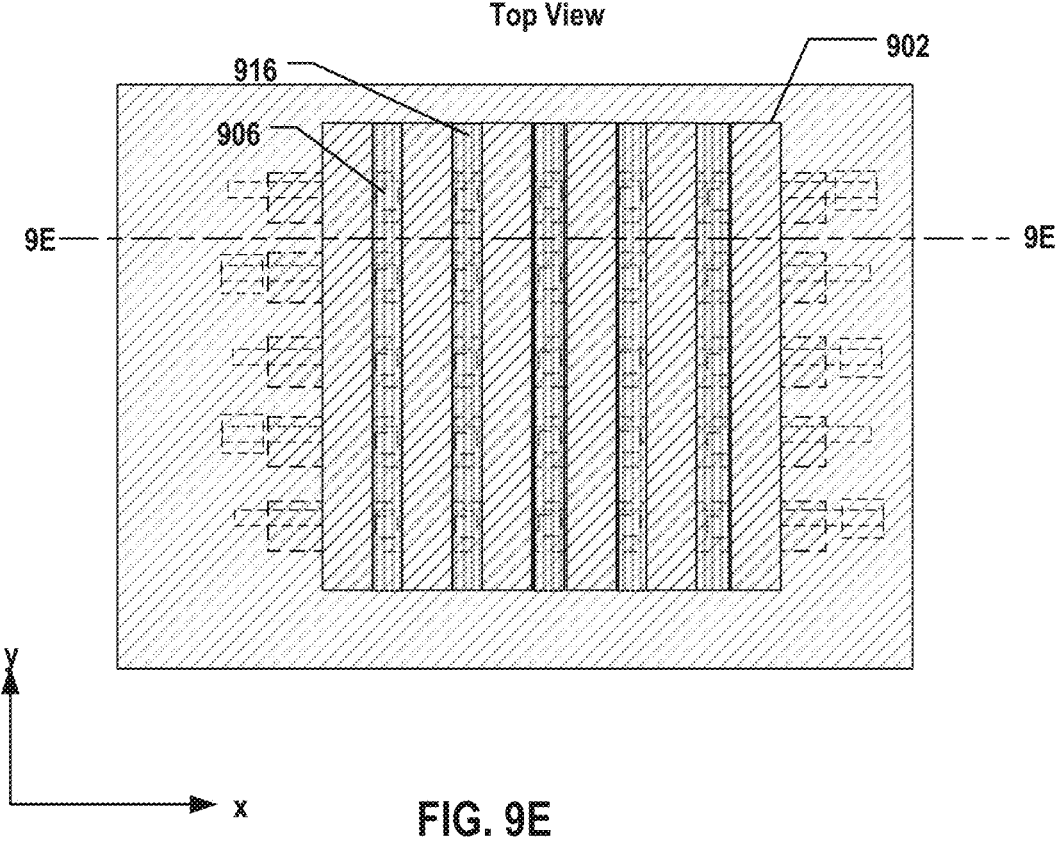

Returning back to FIG. 8, method 800 may proceed to 808, in which a plurality of bit lines may be formed based on protrusions 9022 of separation structures 902. In some implementations, one or more conductive materials may be disposed in recesses 914 to form bit lines. The one or more conductive materials may include polysilicon, metals (e.g., tungsten (W), copper (Cu), aluminum (Al), etc.), metal compounds (e.g., titanium nitride (TiN), tantalum nitride (TaN), etc.), silicides, or a combination thereof. For example, the BOX layer in recesses 914 (between protrusions 9022) may be removed, and a contact layer 916 may be formed in recesses 914, such as a silicide layer using a silicidation process, as shown in FIG. 9E. In some implementations, contact layer 916 may be formed in a main memory area where vertical transistors 906 are formed.

The silicidation process is a process of forming a thin layer of metal silicide (also referred to as "silicide") on the top surface of substrate 900 by heating metal and silicon to a high temperature. The metal used in silicidation may include a refractory metal such as titanium, tungsten, or cobalt. By means of contact layer 916, the contact resistance between vertical transistors 906 and the bit lines can be reduced, and the conductivity of the bit lines can be improved, which may help increase the speed of data transmission in the memory device.

Figure 9F:
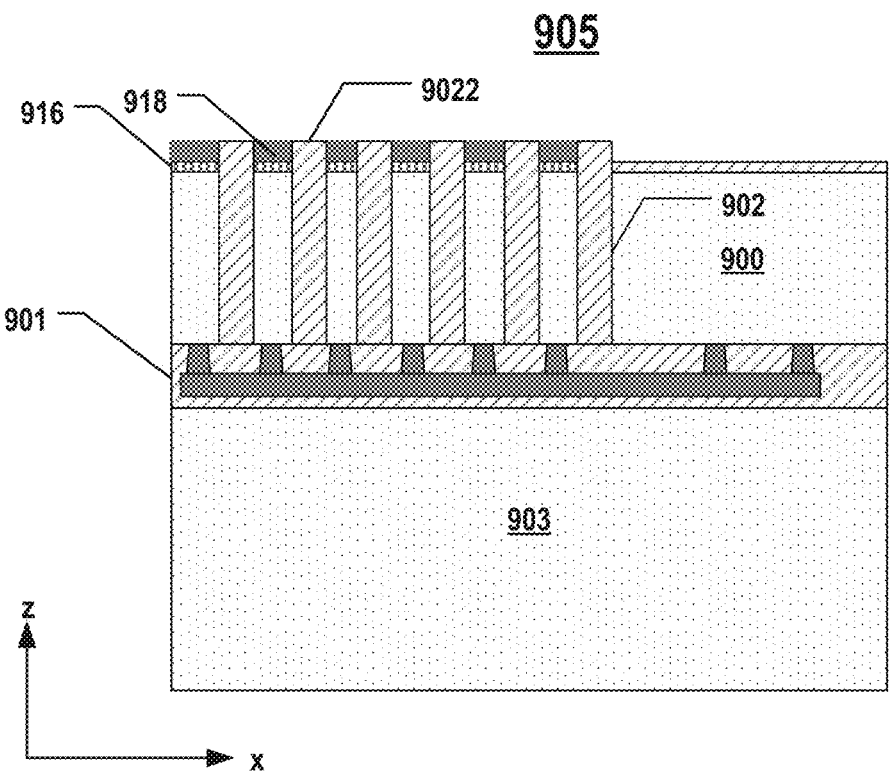
Figure 9F:
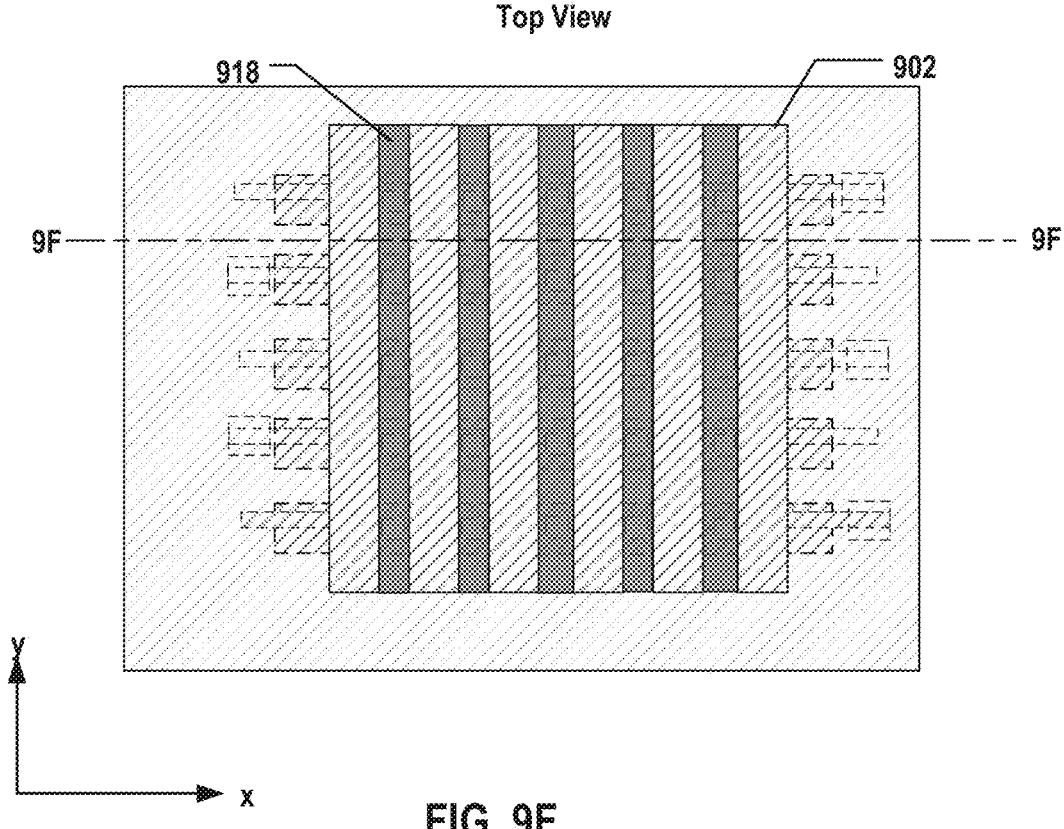

Further, as shown in FIG. 9F, the at least one conductive layer for forming the bit lines may further include a conductive layer 918 arranged on contact layer 916 in recesses 914. In some implementations, conductive layer 918 may be formed by depositing a conductive material, such as metal (e.g., Tungsten) or metal compounds, over contact layer 916 using one or more thin film deposition processes including, but not limited to, CVD, PVD, ALD, or any combination thereof to fill recesses 914. In some implementations, the planarization processes (e.g., chemical mechanical planarization, CMP) may be performed to remove residual materials after forming conductive layer 918 and obtain planarization of conductive layer 918 and protrusions 9022. In some implementations, the top surface of conductive layer 918 may be substantially flush with the top surface of protrusions 9022. Through this manner, conductive layer 918 and contact layer 916 can be arranged between two protrusions 9022, and the projection of conductive layer 918 and contact layer 916, on the plane (e.g., the x-y plane) perpendicular to the cross-sectional plane (e.g., the x-z plane), may substantially have no overlapping with the projection of any one of the two separation structures on the plane.

In some implementations, after forming the bit lines, at least a portion of separation structure 902 may be removed to form an opening, and Tetraethyl Orthosilicate (TEOS) can be filled in the opening to create air gaps with lower dielectric constants. By creating air gaps between the conductive lines (e.g., the bit lines) in the memory device, the capacitance between the conductive lines can be reduced, which in turn reduces signal delay and crosstalk between adjacent conductive lines. It can improve the overall performance of the device and allow for faster data transfer rates.

According to the implementations provided by the present disclosure, a self-alignment mechanism for forming the bit lines may be provided. Consequently, the effective process window can be further increased. In addition, the issue of the insufficient bit-line pickup overlay window introduced by the bonding process can be eliminated. The process flow can then be simplified, the cost can be reduced, and the additional mask layer can be omitted.

Figure 11A:
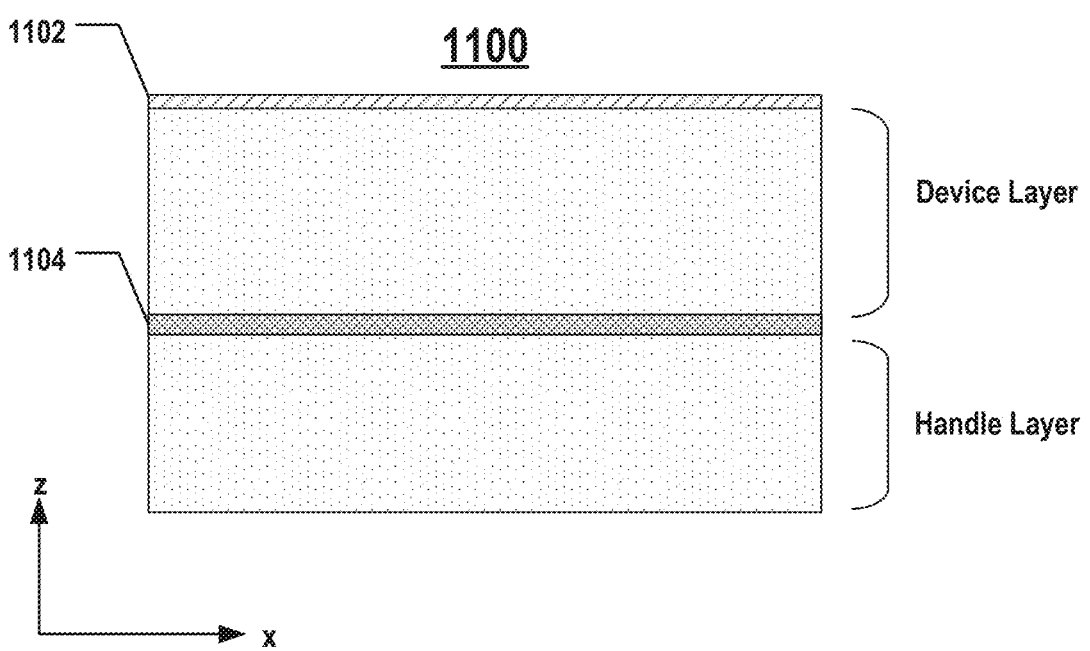
Figure 11A:
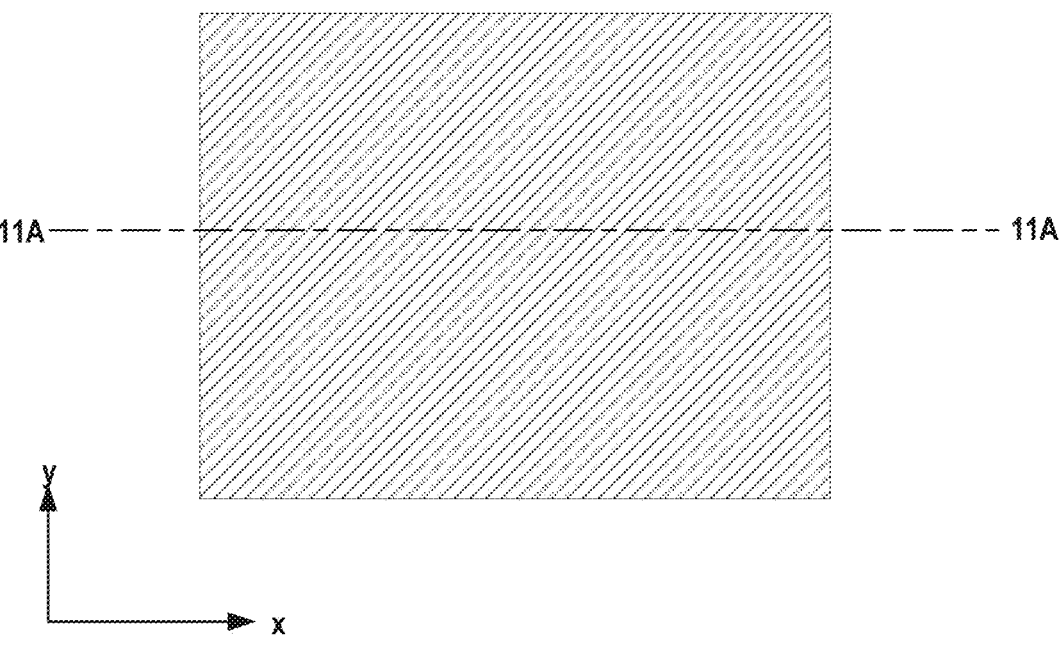

In some implementations, a memory device having separation structures 712 and protrusions 706 on separation structures, as shown in FIG. 7, can be formed by a method different from the method illustrated in FIGS. 9A-9F. FIG. 10 illustrates a flowchart of an exemplary method 1000 for forming separation structures in a 3D memory device, according to some aspects of the present disclosure. At 1002 of method 1000, a transfer substrate 1100, as shown in FIG. 11A, may be prepared. In some examples, transfer substrate 1100 may include a silicon substrate. An oxide pad layer 1102 may be formed on the top surface of transfer substrate 1100. In some implementations, oxide pad layer 1102 (e.g., thermally grown local oxidation of silicon (LOCOS)) including silicon oxide can be formed on transfer substrate 1100.

At 1004, a cut layer 1104 can be formed in transfer substrate 1100, for example, using ion implantation. In some implementations, light elements, such as hydrogen ions, may be implanted into transfer substrate 1100 to a desired depth, for example, by controlling the energy of the ion impanation process, to form cut layer 1104 in transfer substrate 1100, as shown in FIG. 11A. Based on cut layer 1104, transfer substrate 1100 may be divided into two main portions including a device layer and a handle layer.

Method 1000 in FIG. 10 may proceed to 1006, where a sacrificial layer 1106 may be formed on oxide pad layer 1102 of transfer substrate 1100. In some implementations, the material of sacrificial layer 1106 may include silicon nitride (SiN). Sacrificial layer 1106 can be used to define the patterns (locations) for forming the recesses. Further, in the case of shallow trench isolation (STI) and silicon oxide CMP, sacrificial layer 1106 can also be used as a stop layer to help control the depth of a trench or an oxide layer being formed. For example, in the STI process, sacrificial layer 1106 may be used as a stop layer during the CMP process to prevent over-polishing the oxide in a trench.

Figure 11B:
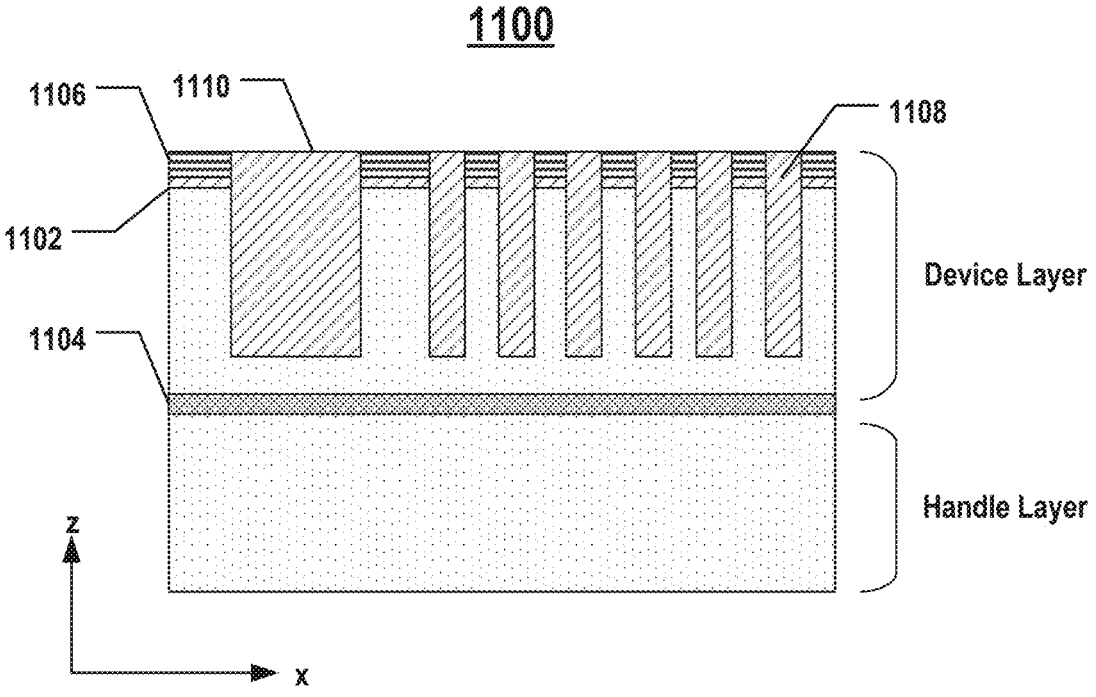
Figure 11B:
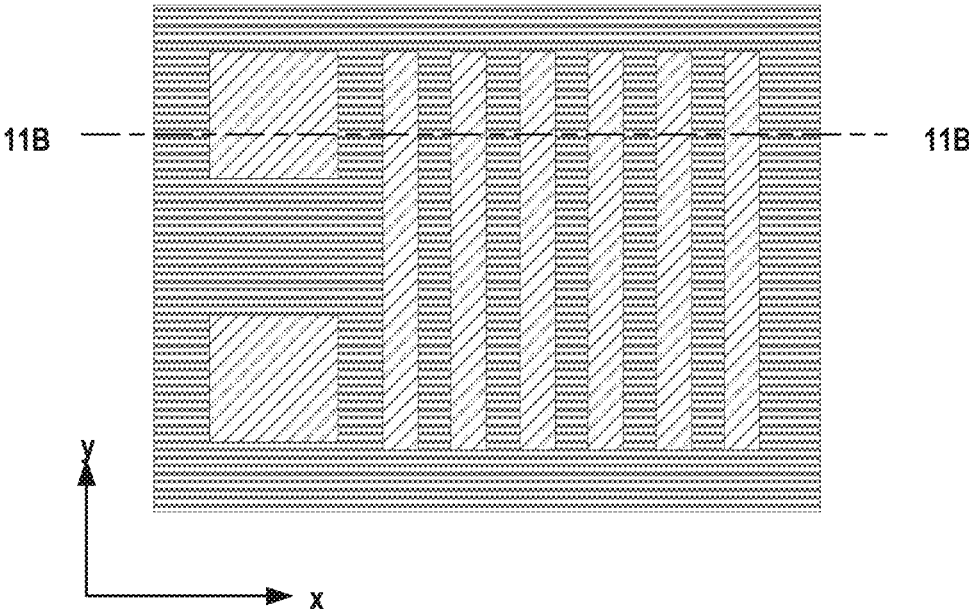

In some implementations, to form separation structures 1108, a first portion of transfer substrate 1100 (including a first portion of device layer and a first portion of oxide pad layer 1102 and sacrificial layer 1106) in an active region may be removed (e.g., using etching) along the first lateral direction (they-direction, referred to as the bit-line direction) to form trenches (not shown). The trenches may be filled with a dielectric material, for example, silicon oxide. Consequently, separation structures 1108 in the first lateral direction can be formed in the active region, as shown in FIG. 11B. The terms "active region" and "main memory area" in the present disclosure may be used interchangeably to refer to a region where the memory cells are formed.

In some implementations, one or more dummy regions 1110 may also be defined and formed in a peripheral area of transfer substrate 1100 by removing a second portion of transfer substrate 1100 (including a second portion of device layer and a second portion of oxide pad layer 1102 and sacrificial layer 1106). An opening can be formed in the peripheral area outside the main memory area and filled with a dielectric material. Dummy regions 1110 may include some dummy features, such as contacts and/or vias formed later in dummy regions 1110. These dummy features can enhance the performance and reliability of the memory device while also improving the efficiency and yield of the fabrication processes.

In some implementations, a planarization/thinning process, such as CMP, can be performed to polish and smooth the top surface of transfer substrate 1100 (at the front side) having separation structures 1108 to remove the residual dielectric material. In some implementations, the top surface of sacrificial layer 1106 may be substantially flush with the top surface of separation structures 1108.

Method 1000 in FIG. 10 may proceed to 1010. At 1010, transfer substrate 1100 may be split at cut layer 1104 by, e.g., applying a mechanical force to transfer substrate 1100, i.e., peeling the device layer from transfer substrate 1100 along cut layer 1104. It can be understood that transfer substrate 1100 may be split at cut layer 1104 by any suitable means, not limited to mechanical force alone, such as thermal means, acoustic means, optical means, etc., or any combination thereof. After the separation, the device layer of transfer substrate 1100 can be flipped upside down, and the front side of transfer substrate 1100 (i.e., the active layer) can be transferred and bonded onto a carrier substrate 1101 to form a semiconductor structure 1103 using a transfer bonding process. In some examples, carrier substrate 1101 may be a silicon substrate.

The transfer bonding can include any suitable substrate/wafer bonding processes including, for example, anodic bonding and fusion (direct) bonding. It can be understood that depending on the bonding processes, dielectric layers (e.g., silicon oxide layers) may be formed on one or both sides of the bonding interface of semiconductor structure 1103. For example, silicon oxide layer 1111 may be formed on the top surfaces of carrier substrate 1101 to allow $SiO_2$—$SiO_2$ bonding using fusion bonding. In some implementations, the back side of semiconductor structure 1103 (i.e., the back side of the former device layer) may be thinned. In some implementations, a planarization process, such as CMP, may be performed to polish and smooth the top surface of semiconductor structure 1103 and adjust the thickness of semiconductor structure 1103 until separation structures 1108 at the back side are exposed. Utilizing a different method illustrated in FIGS. 11A-11C, separation structures 1108 can be formed in the memory device.

Figure 11C:
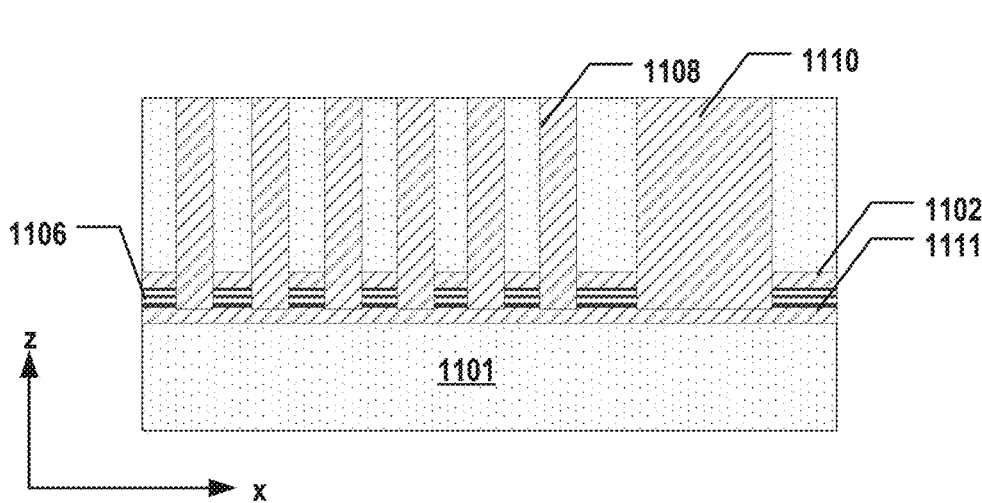
Figure 11C:
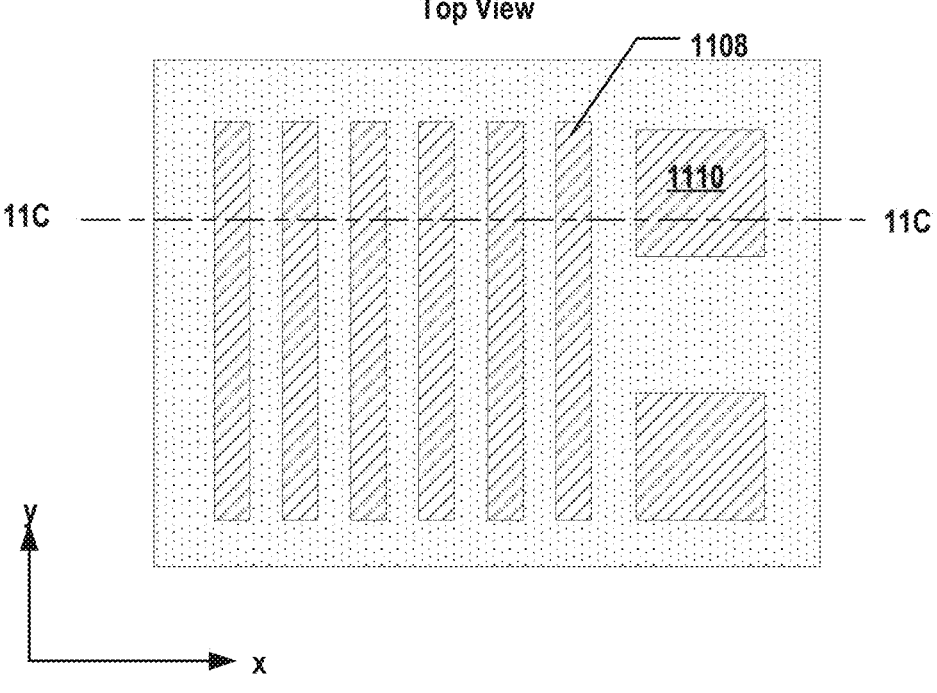
Figure 11D:
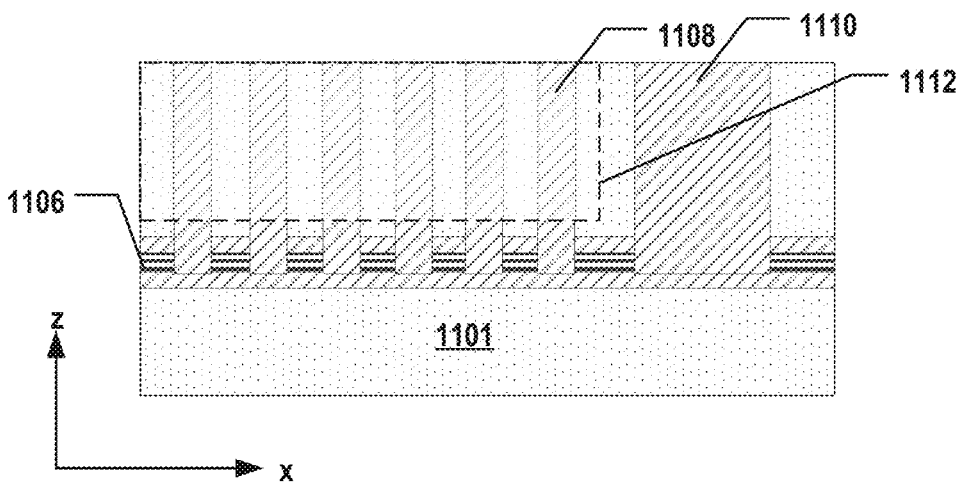
Figure 11D:
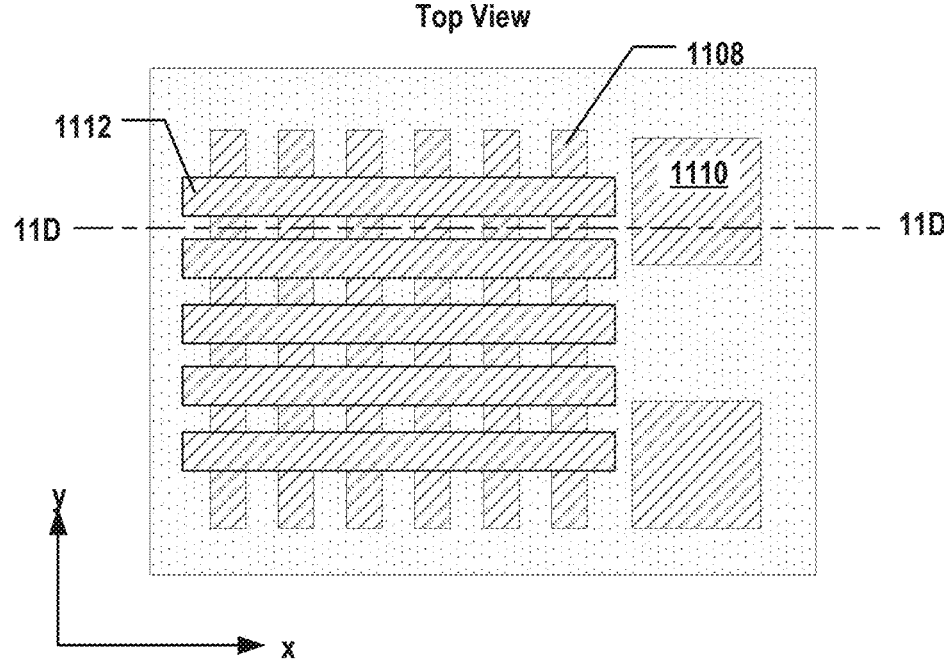
Figure 11E:
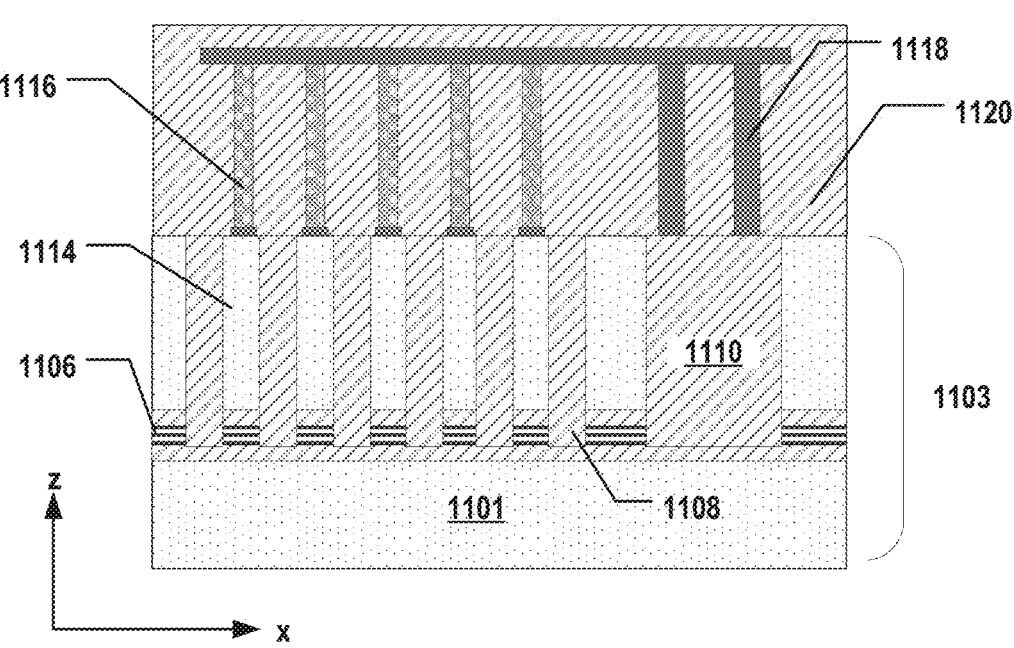
Figure 11F:
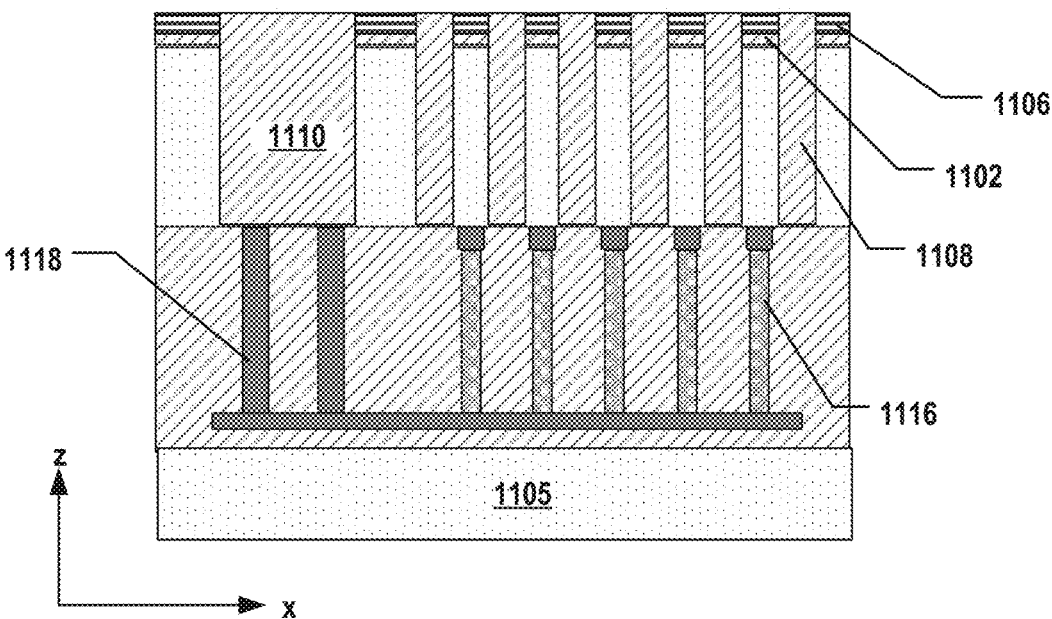
Figure 11F:
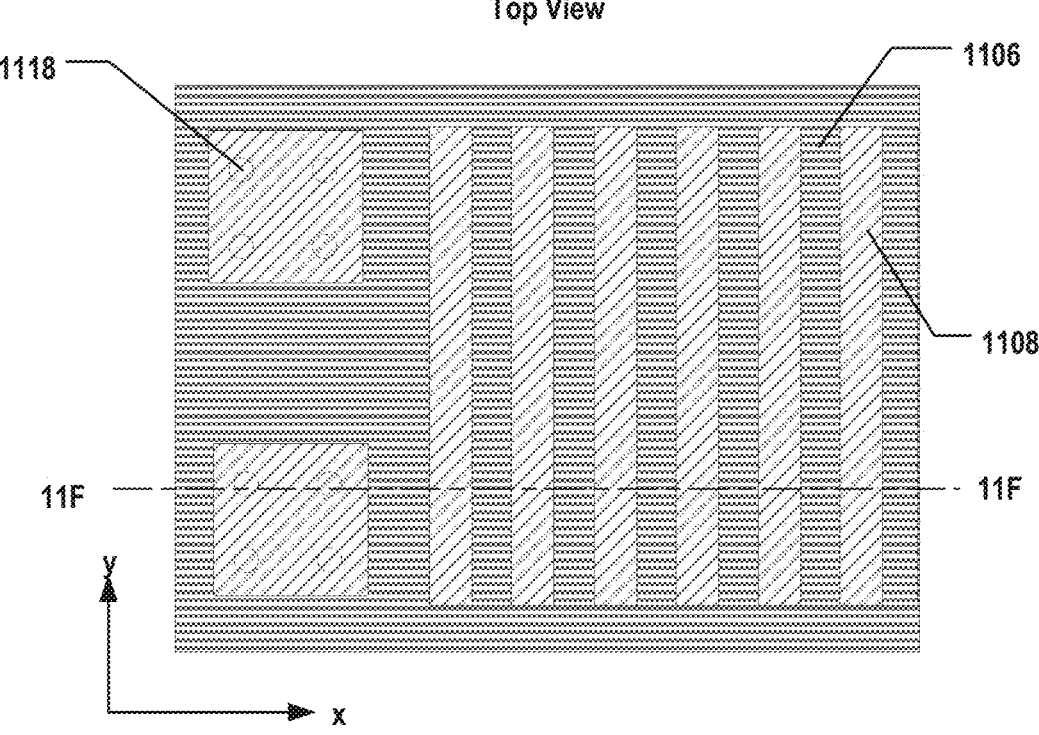

After forming separation structures 1108 shown in FIG. 11C, memory cells including vertical transistors may be formed in the memory device, as shown in FIGS. 11D-11F, as in 804 of method 800. In some implementations, to form vertical transistors and suitable semiconductor components, a portion of semiconductor structure 1103 may be removed (e.g., etching from the top of semiconductor structure 1103) along the second lateral direction (e.g., the x-direction) to form trenches 1112, as shown in FIG. 11D. In the present disclosure, the second lateral direction may be equivalent to the x-direction and referred to as the word-line direction. In some examples, the depth (from the top to the bottom surface along the z-direction) of trench 1112 may be smaller than the depth of each of separation structures 1108, as shown in FIG. 11D. In some implementations, during the removal process(es), sacrificial layer 1106 may function as a stop layer, and the portion of semiconductor structure 1103 can be removed until being stopped by sacrificial layer 1106. Afterward, a dielectric material, for example, silicon oxide, may be filled in trench 1112.

As shown in FIG. 11E, a portion of the dielectric material in trenches 1112 may be removed, and memory cells may be formed in trenches 1112. Each memory cell may include a vertical transistor 1114 that has a semiconductor body, a gate structure, a source, and a drain, as described above. In some implementations, doped regions are formed in the substrate by ion implantation and/or thermal diffusion, which function, for example, as the source and drain of vertical transistor 1114. In some implementations, the semiconductor body can be formed from a portion of the dielectric material in trenches 1112.

Similarly, each vertical transistor 1114 may be formed between two separation structures 1108, in the top view and in the sectional view (as shown in FIG. 11E). In some implementations, word lines, and word-line contacts may also be formed in dummy regions 1110. Word lines may be formed and connected with gate electrodes of vertical transistors, while word-line contacts may be formed and coupled with and controlled by peripheral circuits 402 in FIG. 4.

In some implementations, storage units (e.g., capacitors 1116 in FIG. 11E) and capacitor contacts 1118 connected with vertical transistors 1114 may be formed. Capacitors 1116 may be an exemplary implementation of storage units 412 in FIG. 4 and may include a dielectric material having a high-k value (for example, higher than 3.9). In some implementations, one or more interlayer dielectric (ILD) layers 1120 may be formed over the top surface of semiconductor structure 1103, for example, by depositing dielectric materials using one or more thin film deposition processes including, but not limited to, CVD, PVD, ALD, or any combination thereof. In some examples, the material of ILD layers 1120 may include silicon oxide. Electrodes and capacitor dielectric materials can be subsequently formed in ILD layers 1120 to function as capacitors 1116 in contact and being electrically connected with (e.g., the source of) vertical transistors 1114. Vertical transistors 1114 and capacitors 1116 may be formed in the main memory area, while capacitor contacts 1118 may be formed connecting with capacitors 1116 in the peripheral area. As such, electrical paths may be formed from vertical transistors 1114, capacitors 1116, to capacitor contacts 1118.

In some implementations, the word lines and source lines may be formed, and they can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, the word lines may include tungsten (W).

In some implementations, the front side of semiconductor structure 1103 in FIG. 11E may be bonded to a base substrate 1105, and carrier substrate 1101 and silicon oxide layer 1111 on the back side of semiconductor structure 1103 may be removed to expose sacrificial layer 1106, as shown in FIG. 11F. The bonding processes and the removing processes may include one or more processes as described above, and the present disclosure does not limit thereto. As a result, a semiconductor structure 1107 having the memory cells (including the storage units and vertical transistors 1114 formed between two separation structures 1108) and suitable semiconductor components may be formed on base substrate 1105, as shown in FIG. 11F.

Figure 11G:
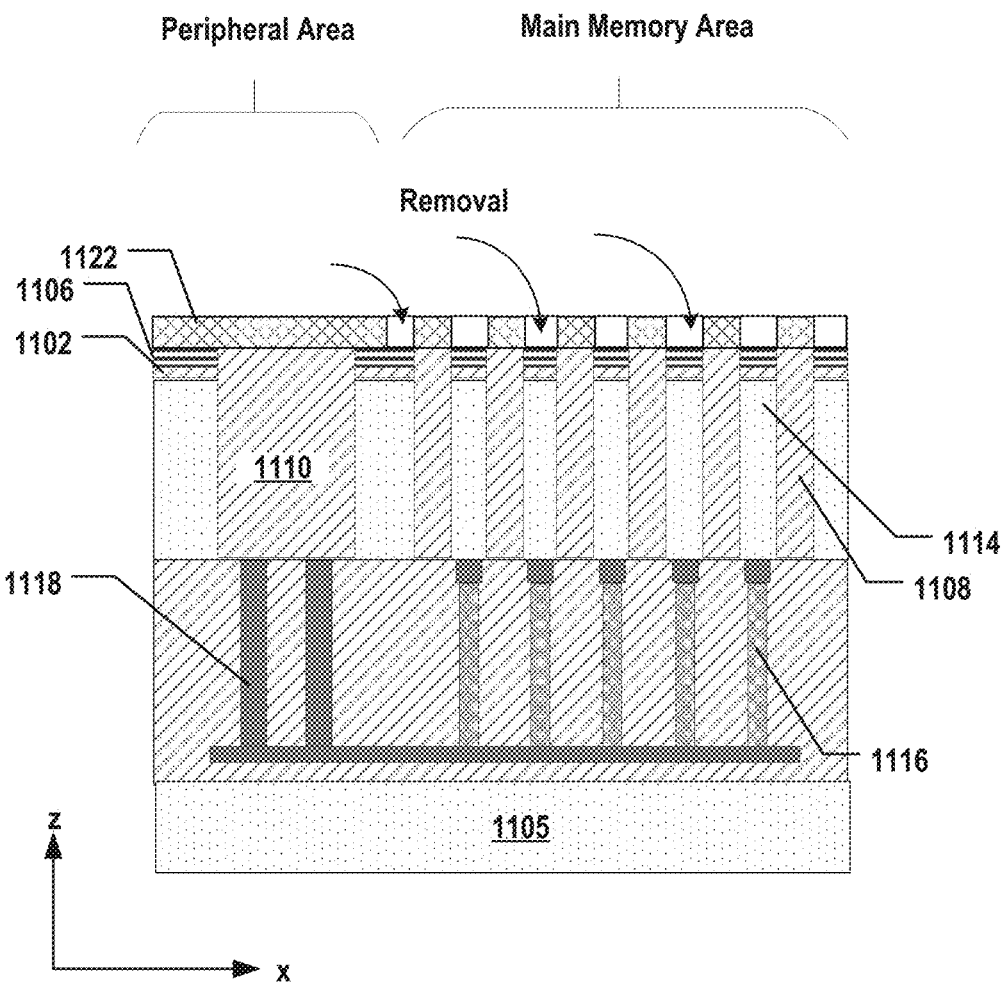

After the formation of semiconductor structure 1107 including the memory cells and suitable semiconductor components, protrusions based on separation structures may be formed, as in 806 of method 800 in FIG. 8. As shown in FIG. 11G, a lithography process may be performed to pattern the front-side surface of semiconductor structure 1107 using an etch mask 1122 (e.g., a photoresist mask) based on the designs and/or locations of separation structures 1108, and one or more dry etching and/or wet etching processes, such as reactive ion etch (RIE), may be performed to remove a portion of sacrificial layer 1106 and oxide pad layer 1102, in the main memory area, over vertical transistors 1114 along the y-direction (referred to as the bit-line direction). Although FIG. 11G illustrates an etch mask 1122, it can be understood that other forms of masks may be applied.

Figure 11H:
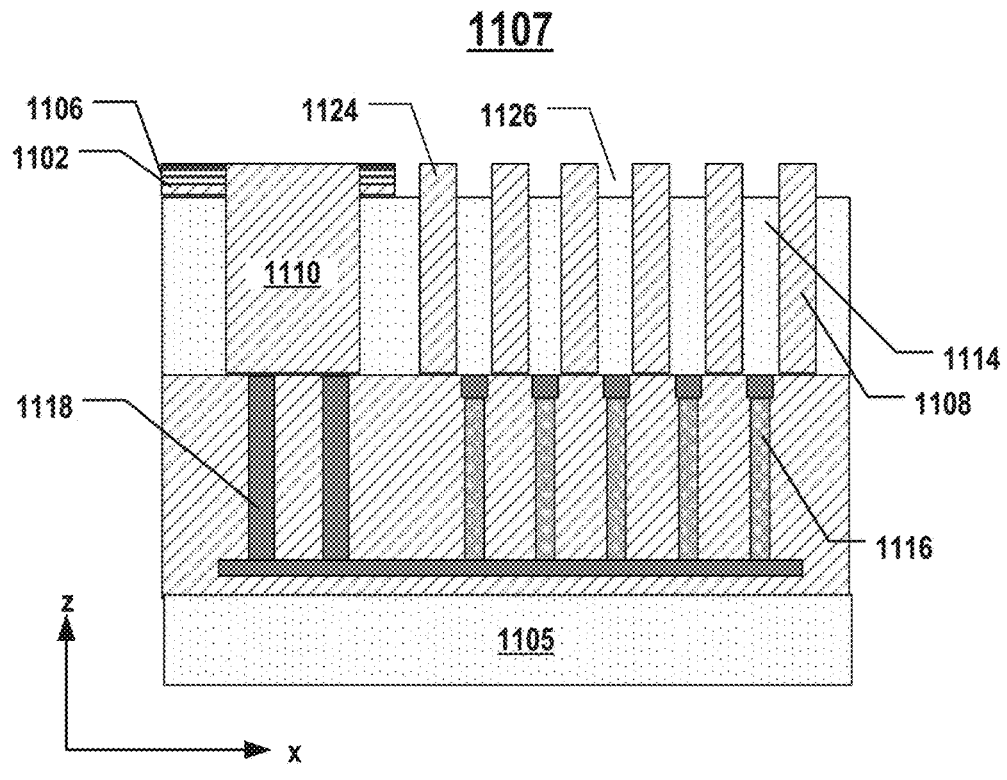
Figure 11H:
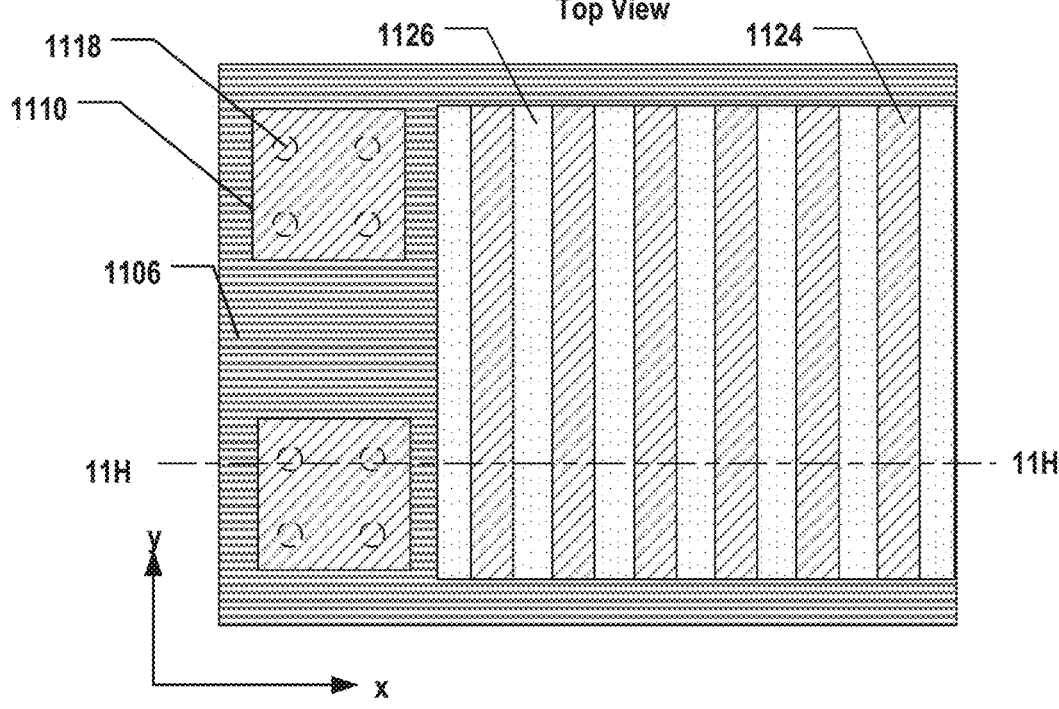

As a consequence, one end of each separation structure 1108 in the main memory area may be exposed, thereby forming a protrusion 1124 on each separation structure 1108, as shown in FIG. 11H. On the other hand, in some implementations, sacrificial layer 1106 and oxide pad layer 1102 in the peripheral area may remain on and cover some regions, as shown in FIG. 11H.

In the sectional view of FIG. 11H, a recess 1126 may be accordingly formed between two protrusions 1124 of separation structures 1108. In some implementations, vertical transistors 1114 may be arranged under recesses 1126, and drains (not shown) of vertical transistors 1114 may be exposed in recesses 1126.

Figure 11I:
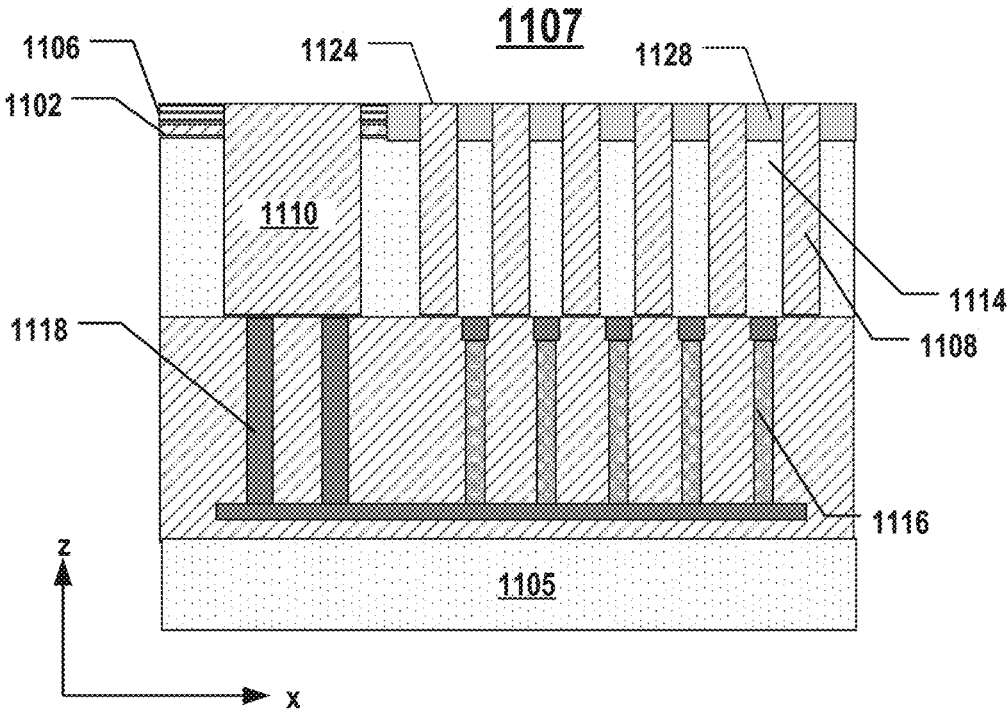
Figure 11I:
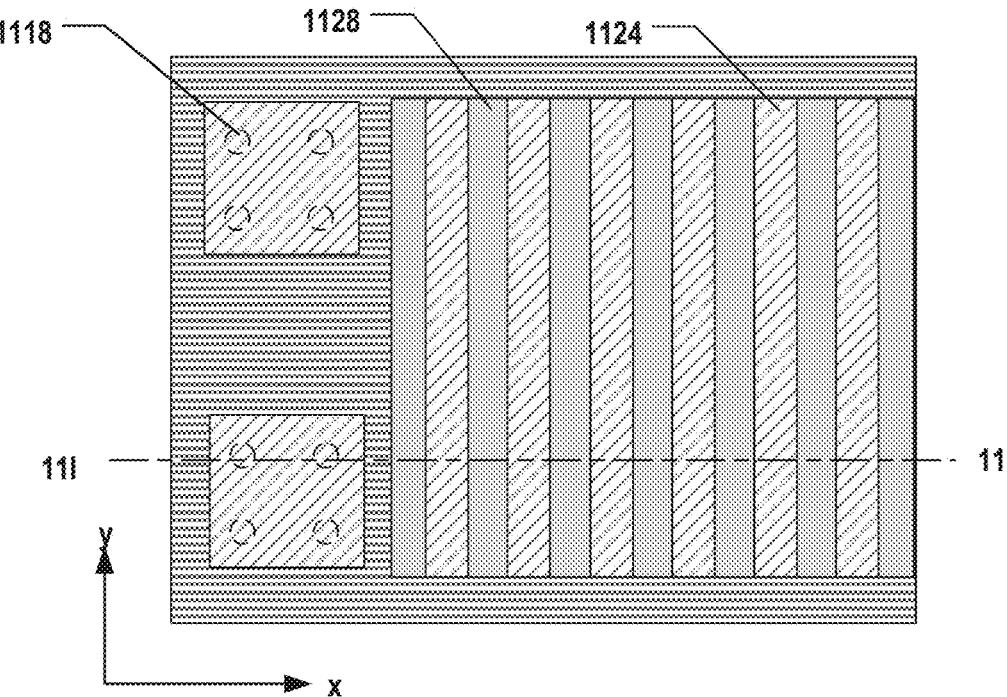

In some implementations, a plurality of bit lines may be formed, as in 808 of method 800. In some implementations, an interconnect layer 1128 including a conductive material may be arranged in recesses 1126, as shown in FIG. 11I, to contact the drains of vertical transistors 1114, thereby leading out the drains of vertical transistors 1114 and forming a portion of the bit lines. In some examples, the conductive material of interconnect layer 1128 may include polysilicon. The polysilicon layer before the formation of a metal layer may provide a good adhesion layer for the metal layer, ensuring that the metal layer can adhere better to an underlying layer while functioning as a barrier layer to prevent metal diffusion into the underlying layer. Nevertheless, in some implementations, the polysilicon layer may be omitted.

In some implementations, rapid thermal annealing (RTA) may be applied to remove, reduce, or eliminate residual stresses in semiconductor structure 1107. During the fabrication process, residual stresses can build up in the memory device, which can affect its performance and reliability. RTA is used to remove the residual stresses by subjecting the memory device to a short burst of high temperature for a short period of time, such as several seconds. In some implementations, a planarization process, such as CMP, may be performed on the front side of semiconductor structure 1107 to polish and smooth the top surface of semiconductor structure 1107 and adjust the thickness thereof. In some implementations, the top surface of interconnect layer 1128 may be substantially flush with the top surface of the two protrusions between which interconnect layer 1128 is arranged. In some implementations, the top surface of interconnect layer 1128 may be substantially flush with the top surface of sacrificial layer 1106 in the peripheral area.

In some implementations, one or more interlayer dielectric (ILD) layers 1130 may be formed over the top surface (the front side) of semiconductor structure 1107, for example, by depositing dielectric materials using one or more thin film deposition processes including, but not limited to, CVD, PVD, ALD, or any combination thereof. In some examples, the material of ILD layers 1130 may include silicon oxide. In some implementations, a metal layer 1132 including a conductive material may be disposed over interconnect layer 1128, thereby forming the bit lines. For example, the conductive material of metal layer 1132 may include any suitable conductive materials, such as metals (e.g., tungsten (W)).

Figure 11J:
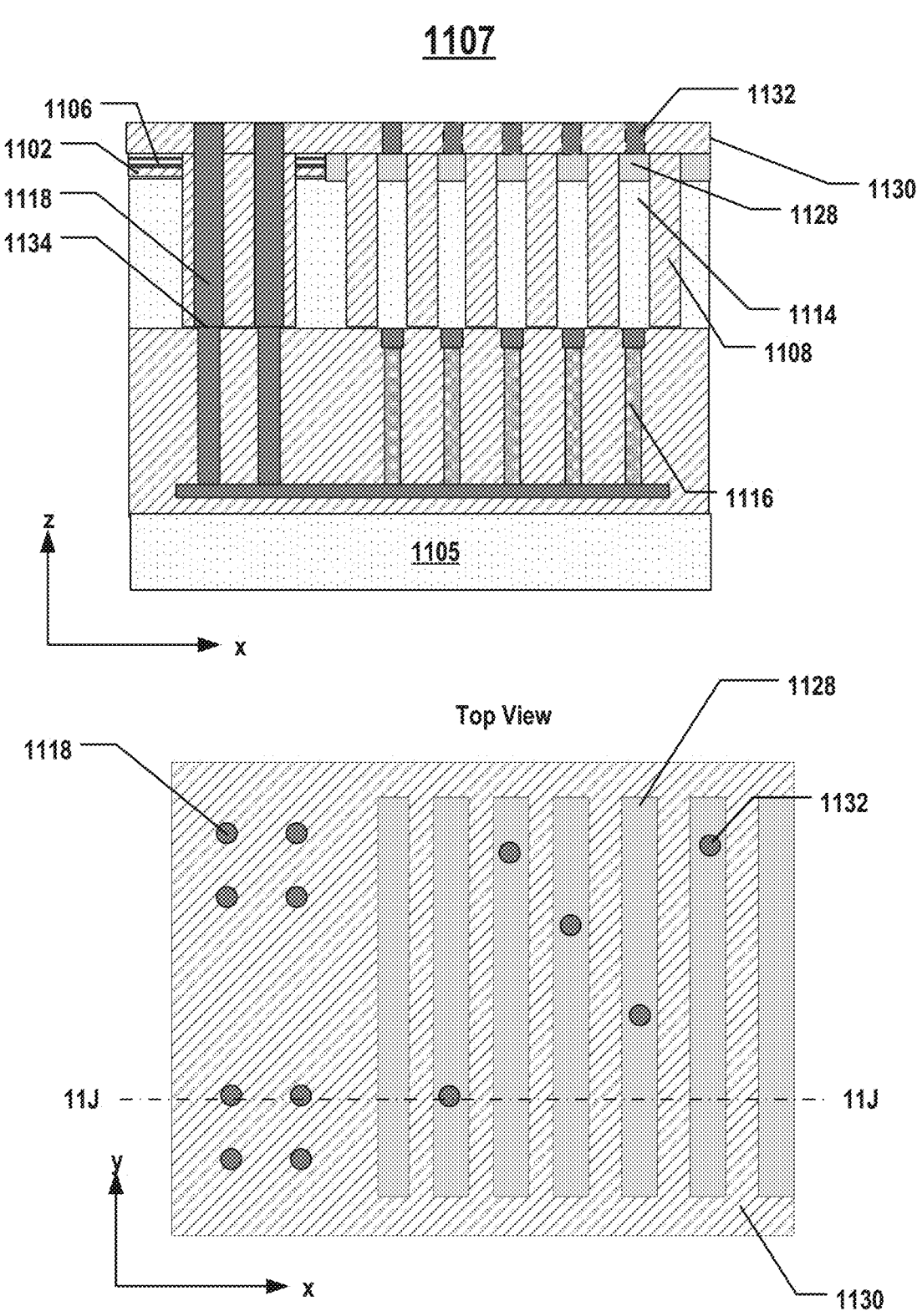

In some implementations, metal layer 1132 may include a metal dot formed on a corresponding interconnect layer 1128, as shown in FIG. 11J. In some implementations, suitable processes may be applied to expose capacitor contacts 1118 on the top surface of ILD layers 1130, as shown in FIG. 11J. For example, a portion of dummy region 1110 and ILD layers 1130 may be removed (by, e.g., etching) to expose capacitor contacts 1118, in ILD layers 1120, and form one or more holes (not shown). Subsequently, a conductive material may be filled in the one or more holes to have electrical contact with capacitor contacts 1118 in ILD layers 1120. The conductive material may be identical to the material of forming capacitor contacts 1118 in ILD layers 1120. As a result, capacitor contacts 1118 may be directed and exposed to the front side of semiconductor structure 1107. In some examples, because the portions of capacitor contact 1118 are formed in different stages, a joint portion 1134 may be formed in each capacitor contact 1118, and the sidewall of capacitor contact 1118 may have a staggered profile (may not be along a straight line) at joint portion 1134. Through the exemplary manner, capacitor contacts 1118 extend along the z-direction along which vertical transistors 1114 extend can be formed.

FIG. 11J provides an implementation of interconnect layer 1128 and metal layer 1132. It can be understood that FIGS. 11I-11J merely provides exemplary implementations in accordance with the scope of the present disclosure, but the present disclosure does not limit thereto. For example, in some implementations, interconnect layer 1128 can be deposited in the bottom part of recesses 1126, while in the top part of recesses 1126, metal layer 1132 can be deposited on interconnect layer 1128, such that one or more layers from ILD layers 1130 may be omitted.

Figure 12A:
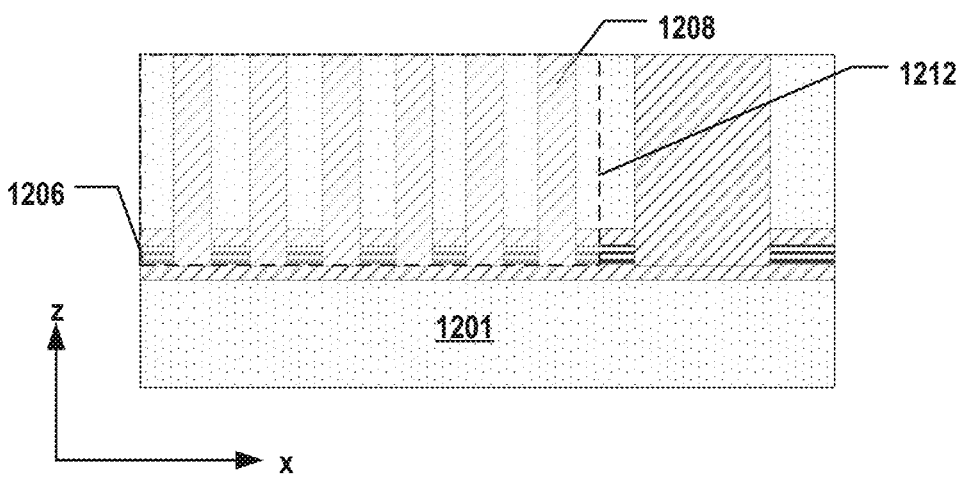
Figure 12A:
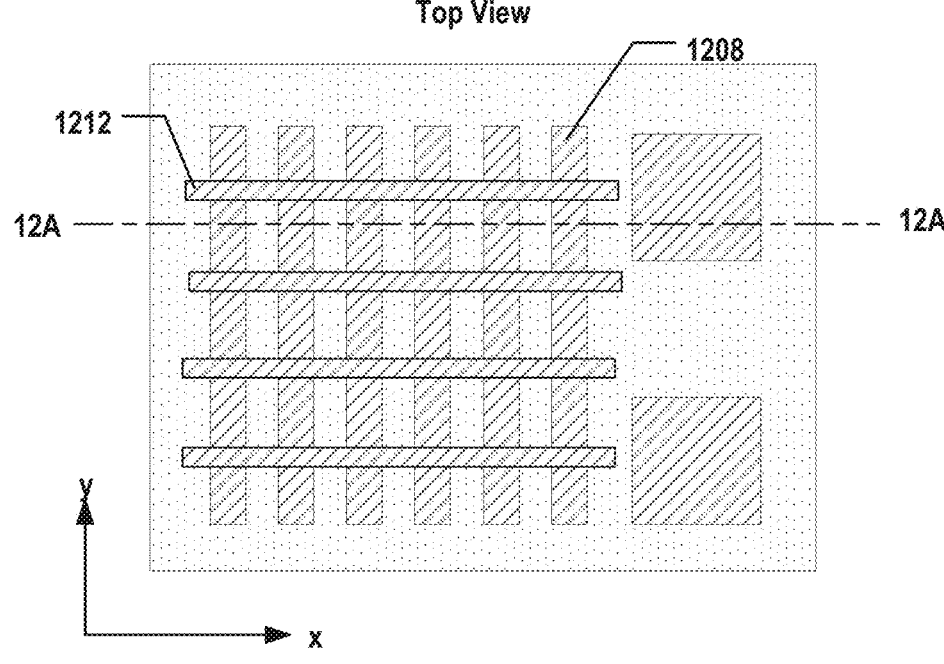

In some implementations as shown in FIG. 11D, the formation of trenches 1112 (as shown in FIG. 11D) stops at or before sacrificial layer 1106, resulting in the depth of trench 1112 is smaller than the depth of separation structure 1108. It can be understood that in some implementations, however, trenches 1212 may penetrate through sacrificial layer 1206, as shown in FIG. 12A. In some examples, a semiconductor structure 1203 on a substrate 1201, similar or identical to semiconductor structure 1103, may be provided. In accordance with the scope of the present disclosure, a portion of semiconductor structure 1203 may be removed (e.g., etching from a front side) along the second lateral direction (e.g., the x-direction) to form trenches 1212, and the portion of semiconductor structure 1203 can be removed until sacrificial layer 1206 is penetrated, as shown in FIG. 12A. In some examples, a dielectric material, for example, silicon oxide, may be filled in trench 1212. Subsequently, a portion of the dielectric material in trenches 1212 may be removed, and memory cells may be formed in trenches 1212.

Figure 12B:
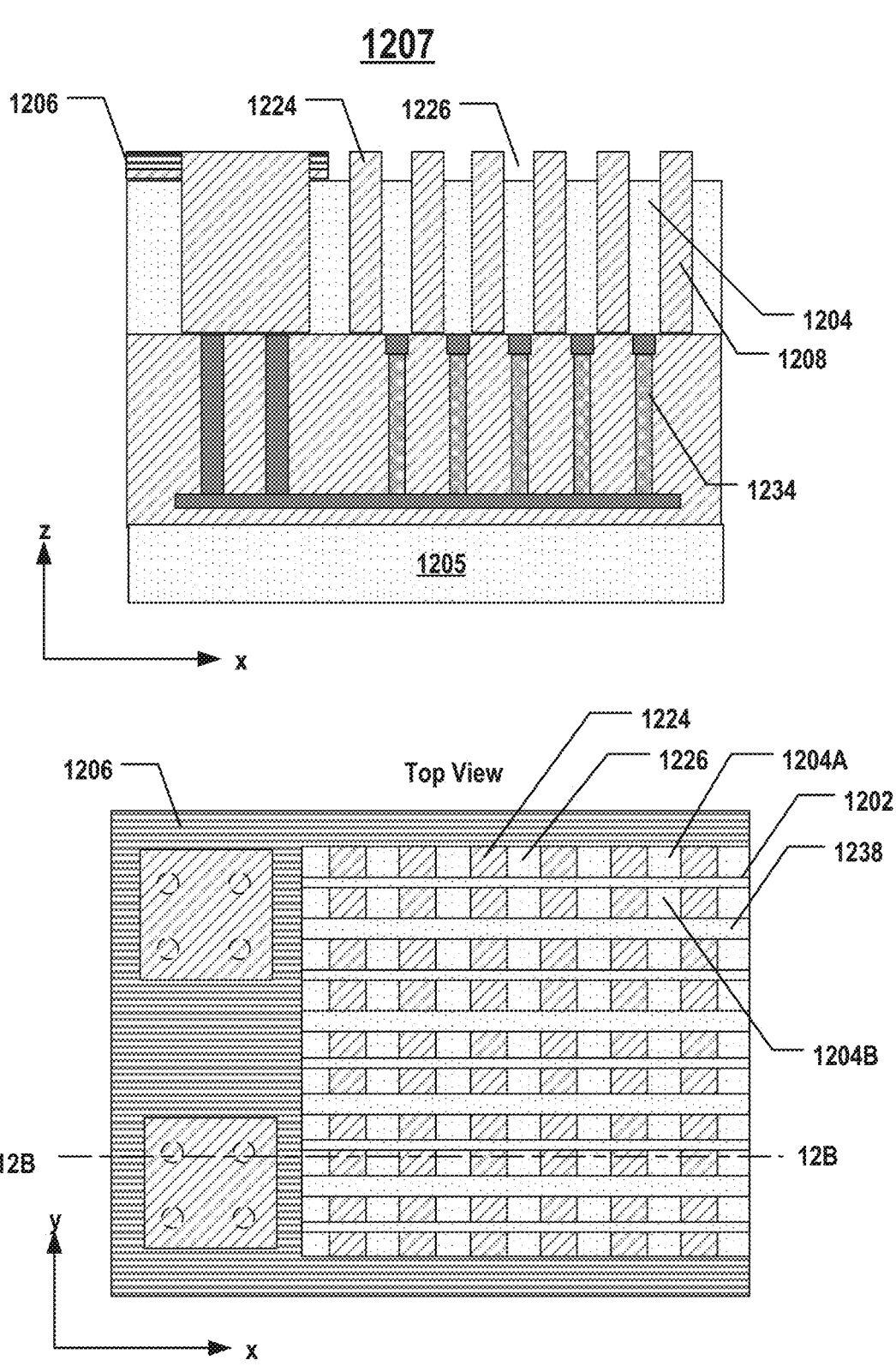

In some implementations, the top side of semiconductor structure 1203 may be bonded to a base substrate 1205 after the formation of memory cells, capacitors, capacitor contacts, word lines 1238, separation structures 1208 having protrusions 1224, recesses 1226, etc., shown in FIG. 12B as a semiconductor structure 1207. The details of the fabrication processes may refer to the above description in regard to FIGS. 11E-11H, and are omitted herein. Due to trenches 1212 penetrating sacrificial layer 1206, each protrusion 1224 of separation structures 1208 may show a discontinuous configuration in the bit-line direction, and so do recesses 1226, as shown in FIG. 12B. Subsequently, an interconnect layer 1228 including a conductive material may be arranged in recesses 1226 of a discontinuous form to contact the drains of vertical transistors 1204, thereby leading out the drains of vertical transistors 1204. For example, the conductive material of interconnect layer 1228 may include polysilicon. As such, interconnect layer 1228 as formed in discontinuous recesses 1226 may also have a disconnected form.

In some implementations, semiconductor bodies of each pair of two adjacent vertical transistors (e.g., 1204A and 1204B) in the bit-line direction (they-direction) can be formed by separating a semiconductor pillar into two pieces using a trench isolation 1202 extending in the word-line direction (the x-direction). Trench isolations 1202 and word lines 1238 can be arranged in an interleaved manner in the bit-line direction. In some implementations, trench isolation 1202 may be formed in the middle of the semiconductor pillars (not shown) such that the resulting pair of semiconductor bodies are mirror-symmetric to one another with respect to trench isolation 1202, so are the pair of vertical transistors 1204 having semiconductor bodies when the respective gate structures are mirror-symmetric to one another with respect to trench isolation 1202 as well.

By splitting the double-gate vertical transistors into single-gate vertical transistors using trench isolations 1202, the number of memory cells (and the cell density) in the bit-line direction can be doubled compared to the structure having double-gate vertical transistors without unduly complexing the fabrication process. On the other hand, it can be understood that in some examples, trench isolations 1202 extending in the word-line directions may not be formed such that two adjacent semiconductor bodies separated by a respective trench isolation 1202 may be merged as a single semiconductor body having two opposite sides in the bit-line direction in contact with a gate structure.

In some implementations, rapid thermal annealing (RTA) may also be applied to remove, reduce, or eliminate residual stresses in semiconductor structure 1207. In some implementations, a planarization process, such as CMP, may also be performed on the top surface of semiconductor structure 1207. In some implementations, one or more interlayer dielectric (ILD) layers 1230 may also be formed over the top surface of semiconductor structure 1207. In some examples, the material of ILD layers 1230 may also include silicon oxide.

Figure 12C:
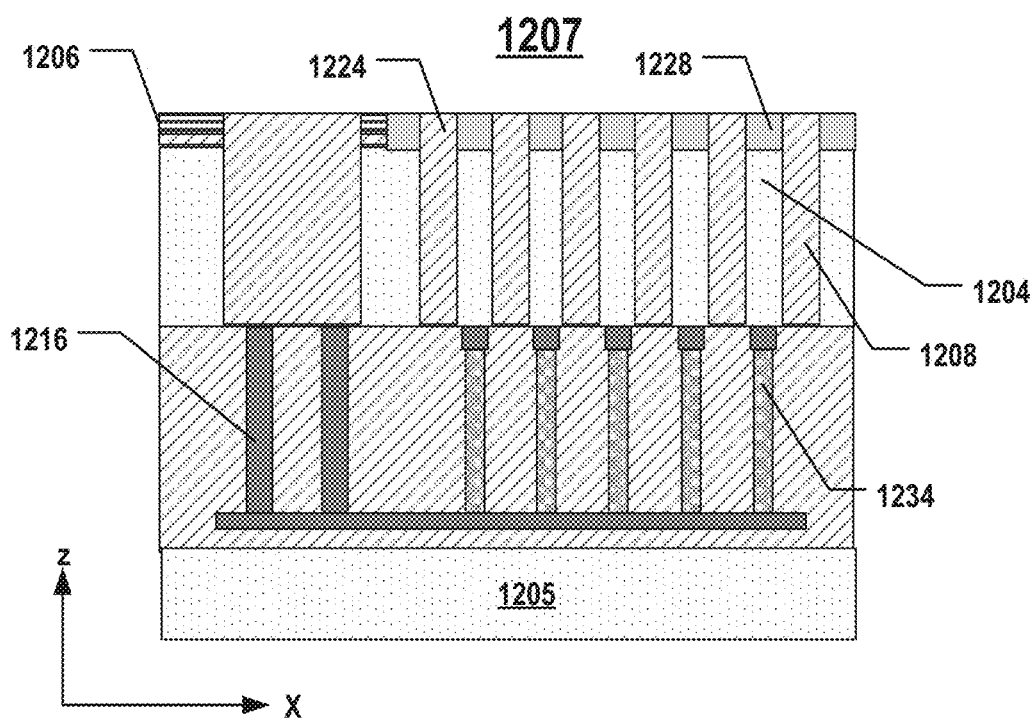
Figure 12C:
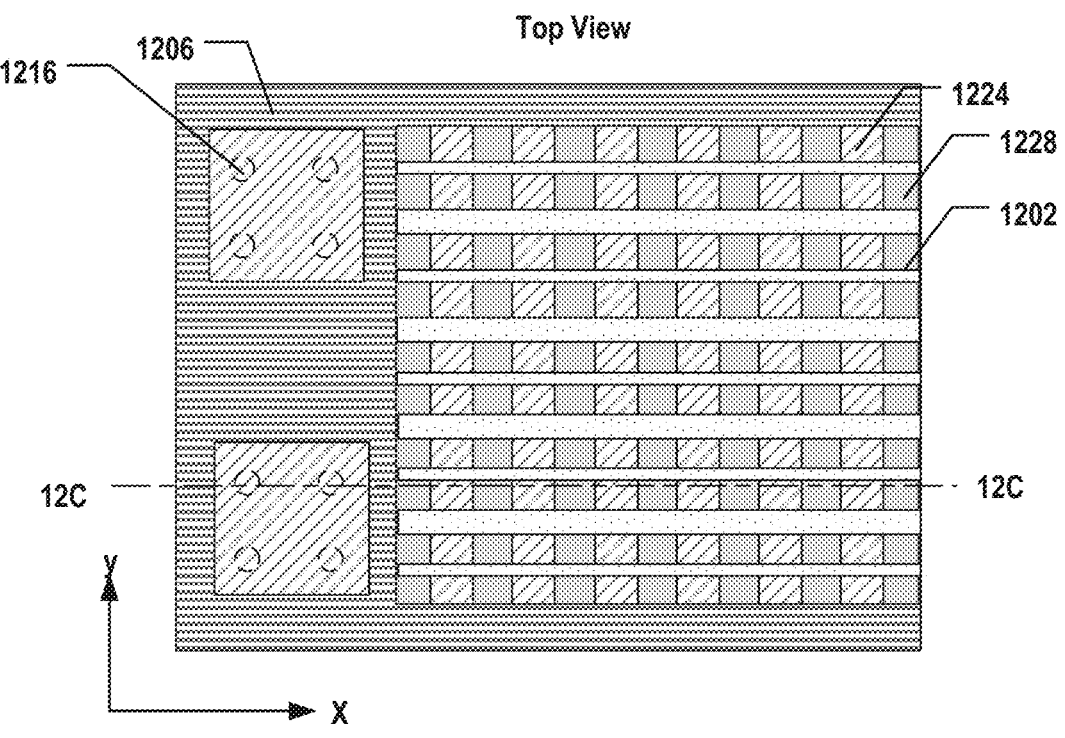
Figure 12D:
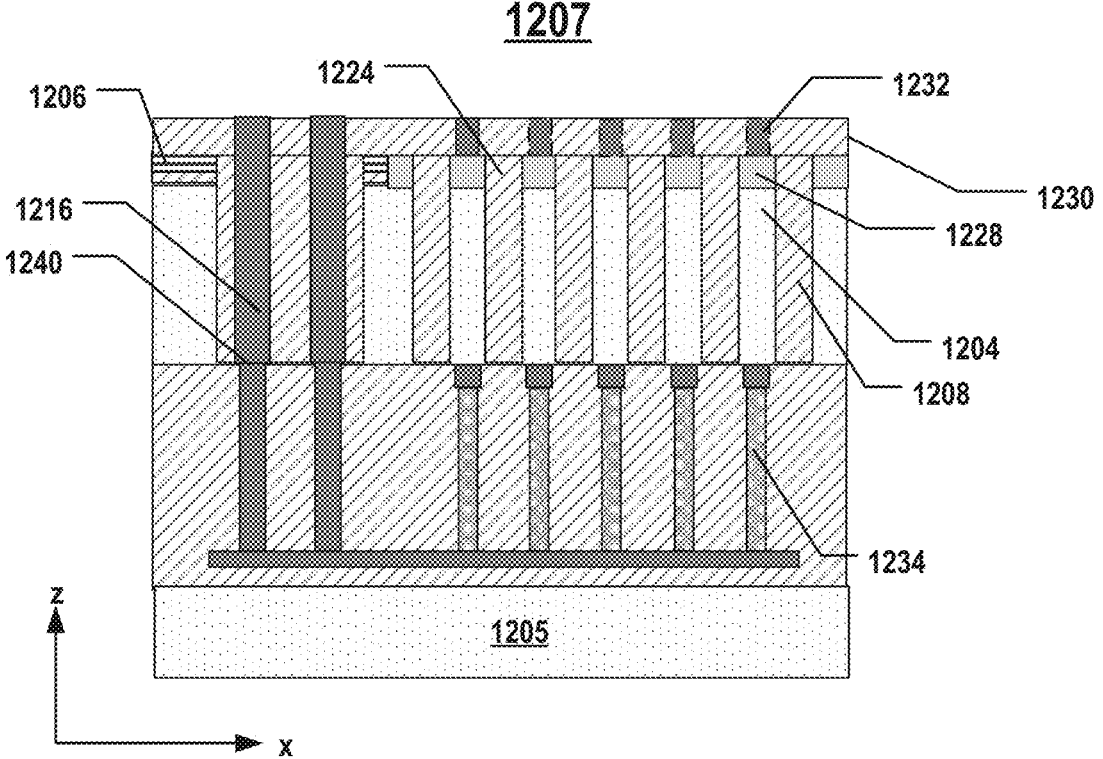
Figure 12D:
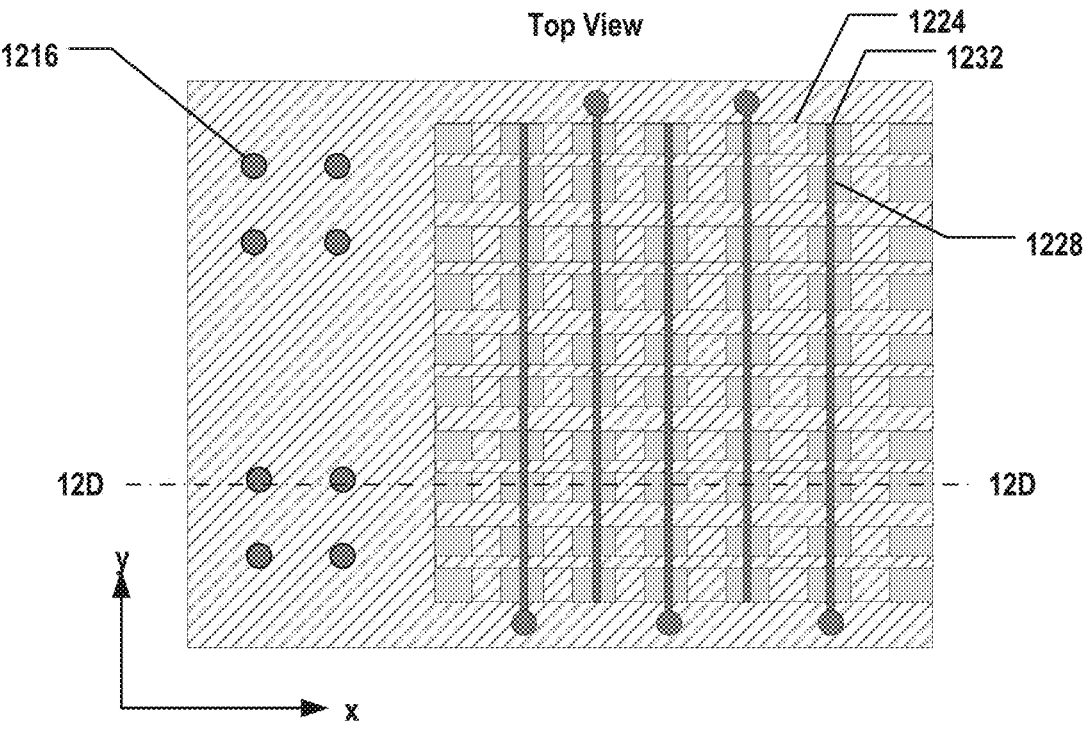

In some implementations, a metal layer 1232 including a conductive material may also be formed over interconnect layer 1228, thereby forming the bit lines, as shown in FIG. 12C. For example, the conductive material of metal layer may include any suitable conductive materials, such as metals (e.g., tungsten (W)). In some implementations, metal layer 1232 may include a continuous conductive wire connecting the corresponding discontinuous interconnect layer 1228 to form the bit lines, as shown in FIG. 12D. In some implementations, suitable processes may also be applied to expose capacitor contacts 1216 on the top surface of ILD layer 1230, as shown in FIG. 12D. Capacitor contacts 1216 may be formed in a manner to direct capacitors 1234 to the top surface in the peripheral area. In some examples, the sidewall of capacitor contact 1216 may have a staggered profile (or may not be along a straight line) at a joint portion 1240 formed due to capacitor contact 1216 being formed in different stages). In some implementations, after the formation of the bit lines, a portion of separation structure 1208 may be removed so as to form an opening, and TEOS can be filled in the opening to create air gaps.

In some implementations, separation structures 712 and protrusions 706 on separation structures, as shown in FIG. 7, may be formed in still another method different from the methods illustrated in FIGS. 9A-9F and FIGS. 11A-11C. FIG. 13 illustrates a flowchart of an exemplary method 1300 for forming separation structures in a 3D memory device, according to some aspects of the present disclosure. At 1302 of method 1300, a transfer substrate 1400 may be prepared. In some examples, transfer substrate 1400 may include a silicon substrate.

Further, at 1304 of method 1300, a cut layer 1402 may be formed in substrate 1400, for example, using ion implantation. In some implementations, light elements, such as hydrogen ions, may be implanted into substrate 1400 to a desired depth, for example, by controlling the energy of the ion impanation process, to form cut layer 1402 in transfer substrate 1400, as shown in FIG. 14A. In accordance with the scope of the present disclosure, a first oxide pad layer 1404, such as a silicon oxide layer, may be formed on transfer substrate 1400, as shown in FIG. 14A. In some implementations, the first oxide pad layer may be formed through, e.g., thermally grown local oxidation of silicon (LOCOS). Subsequently, a sacrificial layer 1406 may be formed on first oxide pad layer 1404, for example, through one or more thin film deposition processes. The one or more thin film deposition processes may include, but not limited to, CVD, PVD, ALD, or any combination thereof. In some implementations, the material of sacrificial layer 1406 may include silicon nitride (SiN). As described above, sacrificial layer 1406 can be used to define the patterns (locations) for forming recesses. Further, in the case of shallow trench isolation (STI) and silicon oxide CMP, sacrificial layer 1406 can be used as a stop layer to help control the depth of a trench or an oxide layer being formed. For example, in the STI process, sacrificial layer 1406 may be used as a stop layer during the CMP process to prevent over-polishing the oxide in a trench.

Method 1300 may proceed to 1306. At 1306, a device layer 1408 of transfer substrate 1400 may be split at cut layer 1402 by applying, e.g., a mechanical force to transfer substrate 1400, i.e., peeling of device layer 1408 away from a handle layer of transfer substrate 1400. After the separation, device layer 1408 of transfer substrate 1400 can be flipped upside down, and the front side of device layer 1408 can be transferred and bonded onto a carrier substrate 1401 to form a semiconductor structure 1403 using, e.g., a transfer bonding process. In some examples, carrier substrate 1401 may include a silicon substrate.

In some implementations, to better bond device layer 1408 with carrier substrate 1401, a second oxide pad layer 1410, such as silicon oxide layer, may be formed on at least one of carrier substrate 1401 or device layer 1408. Consequently, semiconductor structure 1403 can be formed. Semiconductor structure 1403 may have a sandwich structure similar to an SOI substrate but the BOX layer of the SOI substrate may be replaced by an oxide-SiN mixed interface between device layer 1408 and carrier substrate 1401, as shown in FIG. 14B.

In some implementations, the back side of semiconductor structure 1403, i.e., the back side of former carrier substrate 1401, may be thinned after the bonding. For example, a planarization process, such as CMP, may be performed on the backside of semiconductor structure 1403 to adjust the thickness of semiconductor structure 1403.

Further, method 1300 may proceed to 1308. At 1308, a first portion of semiconductor structure 1403 may be removed (e.g., using etching) in the active region along the first lateral direction (the y-direction, referred to as the bit-line direction) to form trenches. The trenches may be filled with a dielectric material, for example, silicon oxide. Consequently, separation structures 1412 extending in the first lateral direction can be formed in the trenches of the active region, as shown in FIG. 14C. In some implementations, one or more dummy regions 1110 may also be defined and formed in semiconductor structure 1403 through removing a second portion of semiconductor structure 1403 to form an opening and filling the opening with a dielectric material. In some examples, a planarization process, such as CMP, can be performed to polish and smooth the top surface of semiconductor structure 1403 having separation structures 1412 to remove extra silicon oxide.

In some implementations, the subsequent processes after FIG. 14C may be, at least in part, similar/identical to the description above in regard to FIGS. 11D-11J. For the ease of the description, details of the processes may be referred to those in the above description.

Accordingly, the present disclosure provides a memory device having vertical transistors and a self-aligned mechanism for forming bit lines. In some implementations, recesses can be formed between two of the protrusions and above the vertical transistors in the memory device. Accordingly, the formation of bit lines can be easily located with respect to the recesses, and the bit lines can be accordingly formed in the recesses. Consequently, the lithography process for the bit-line pickups can be avoided, and the effective process window can be increased. As a result, the process flow is simplified, the cost is reduced, and the additional lithography mask is omitted.

The foregoing description of the specific implementations will so reveal the general nature of the present disclosure that others can, by applying knowledge within the skill of the art, readily modify and/or adapt for various applications such specific implementations, without undue experimentation, without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A memory device, comprising:
an array of memory cells each comprising a vertical transistor, wherein along a first direction, one of the vertical transistors is arranged between two of separation structures in a plan view, each of the separation structures comprising a protrusion, and the separation structure and a corresponding protrusion being integral; and
a plurality of bit lines comprising at least one conductive layer, wherein:
two protrusions of the two separation structures extend from an end surface of the one of the vertical transistors to form a recess between the two protrusions of the two separation structures along the first direction; and
the at least one conductive layer is configured to fill the recess between the two protrusions of the two separation structures and is arranged on the end surface of the one of the vertical transistors to couple one of the bit lines with the one of the vertical transistors.

2. The memory device of claim 1, wherein:
the plan view is based on a first plane along the first direction; and
a projection of the at least one conductive layer, arranged between the two protrusions, on a second plane substantially has no overlapping with a projection of each of the two separation structures on the second plane, the second plane being perpendicular to the first plane.

3. The memory device of claim 1, further comprising:
a plurality of word lines extending in the first direction and configured to connect gates of the vertical transistors, a depth of one of the word lines being smaller than a depth of one of the separation structures.

4. The memory device of claim 1, wherein:
a capacitor is arranged in one or more inter-layer dielectric (ILD) layers at an opposite side of the bit lines.

5. The memory device of claim 4, wherein:
the array of memory cells is arranged in a main memory area; and
the memory device further comprises a capacitor contact arranged in a peripheral area outside the main memory area and electrically connected with the capacitor in the main memory area, the capacitor contact extending in a third direction along which the vertical transistors extend and comprising a joint portion, and sidewalls of the capacitor contact comprising a staggered profile at the joint portion.

6. The memory device of claim 1, wherein:
a surface of the at least one conductive layer of the bit lines is substantially flush with a surface of the two protrusions of the two separation structures.

7. The memory device of claim 1, wherein the at least one conductive layer comprises:
a contact layer arranged between the two protrusions and in contact with the one of the vertical transistors; and
a metal layer arranged between the two protrusions and on the contact layer.

8. The memory device of claim 1, wherein:
the at least one conductive layer comprises an interconnect layer arranged between the two protrusions and in contact with the one of the vertical transistors, the interconnect layer being arranged in a main memory area; and
a sacrificial layer is arranged in a peripheral area outside the main memory area, a surface of the interconnect layer in the main memory area is substantially flush with a surface of the sacrificial layer in the peripheral area.

9. The memory device of claim 8, wherein the bit lines further comprise a metal layer disposed in one or more inter-layer dielectric (ILD) layers and arranged on and in contact with the interconnect layer.

10. The memory device of claim 9, wherein the metal layer comprises a metal dot disposed on the interconnect layer.

11. The memory device of claim 9, wherein:
the interconnect layer is disconnected in a second direction perpendicular to the first direction; and
the metal layer comprises a metal wire connecting the interconnect layer.

12. A memory system, comprising:
a memory device configured to store data and comprising:
a first semiconductor structure comprising peripheral circuits; and
a second semiconductor structure bonded to the first semiconductor structure and comprising:
an array of memory cells each comprising a vertical transistor, wherein along a first direction, one of the vertical transistors is arranged between two of separation structures in a plan view, each of the separation structures comprising a protrusion, and the separation structure and a corresponding protrusion being integral; and
a plurality of bit lines comprising at least one conductive layer, wherein:
two protrusions of the two separation structures extend from an end surface of the one of the vertical transistors to form a recess between the two protrusions of the two separation structures along the first direction; and
the at least one conductive layer is configured to fill the recess between the two protrusions of the two separation structures and is arranged on the end surface of the one of the vertical transistors to couple one of the bit lines with the one of the vertical transistors, the memory cells being coupled to the peripheral circuits through the bit lines; and
a memory controller coupled to the memory device and configured to control the memory cells through the peripheral circuits.

13. A method of forming a memory device, comprising:
forming a plurality of separation structures;
forming an array of memory cells each comprising a vertical transistor, wherein along a first direction perpendicular to a second direction along which the separation structures extend, one of the vertical transistors is arranged between two of the separation structures in a plan view;

forming a plurality of protrusions each on one of the separation structures; and forming a plurality of bit lines comprising at least one conductive layer, wherein:

two protrusions of the two separation structures extend from an end surface of the one of the vertical transistors to form a recess between the two protrusions of the two separation structures along the first direction; and the at least one conductive layer is configured to fill the recess between the two protrusions of the two separation structures and is arranged on the end surface of the one of the vertical transistors to couple one of the bit lines with the one of the vertical transistors.

14. The method of claim 13, further comprising:

forming a capacitor contact in a peripheral area outside a main memory area and electrically connected with a capacitor in the main memory area, the capacitor being connected with the one of the vertical transistors at an opposite side of the bit lines, wherein the capacitor contact extends in a third direction along which the vertical transistors extend and comprises a joint portion, sidewalls of the capacitor contact comprising a staggered profile at the joint portion.

15. The method of claim 14, wherein forming the plurality of separation structures comprises:

preparing a transfer substrate comprising a cut layer in a silicon substrate and a device layer comprising an oxide pad layer on the silicon substrate, and a sacrificial layer on the oxide pad layer;

splitting a device layer off from the transfer substrate along the cut layer;

bonding a front side of the device layer to a carrier substrate to form a third semiconductor structure;

removing a portion of the third semiconductor structure to form a plurality of fourth trenches along the second direction; and filling a third dielectric material into each of the plurality of fourth trenches to form the separation structures.

16. The method of claim 14, wherein forming the plurality of separation structures comprises:

preparing a transfer substrate comprising a silicon substrate, a cut layer in the silicon substrate, and an oxide pad layer on the silicon substrate;

forming a sacrificial layer on the oxide pad layer;

removing a portion of the oxide pad layer and the sacrificial layer in a device layer of the transfer substrate to form a plurality of third trenches along the second direction;

filling a second dielectric material into each of the plurality of third trenches to form the separation structures;

splitting the device layer from the transfer substrate along the cut layer;

bonding a front side of the device layer to a carrier substrate to form a first semiconductor structure; and removing a back side of the device layer to expose the separation structures.

17. The method of claim 16, wherein:

the portion of the oxide pad layer and the sacrificial layer as removed is a first portion of the oxide pad layer and the sacrificial layer;

the array of memory cells is arranged in a main memory area; and a second portion of the oxide pad layer and the sacrificial layer remains in a peripheral area outside the main memory area.

18. The method of claim 13, wherein forming the plurality of separation structures comprises:

preparing a substrate comprising a device layer, a handle layer, and a buried oxide (BOX) layer between the device layer and the handle layer;

removing, at least through the BOX layer, a first portion of the device layer and the handle layer to form a plurality of first trenches along the second direction; and filling a first dielectric material into each of the plurality of first trenches to form the separation structures in the substrate.

19. The method of claim 18, further comprising:

removing a second portion of the device layer to form a plurality of second trenches along the first direction, wherein:

forming the memory cells comprises forming the vertical transistors corresponding to the second trenches; and the method further comprises forming a plurality of word lines each corresponding to one of the second trenches and configured to connect gates of the vertical transistors in a row of the array of memory cells.

20. The method of claim 19, wherein a depth of one of the second trenches is less than a depth of one of the first trenches.

* * * * *